(12) United States Patent
Park et al.

(10) Patent No.: US 10,147,616 B2
(45) Date of Patent: Dec. 4, 2018

(54) PACKAGE FRAME AND METHOD OF MANUFACTURING SEMICONDUCTOR PACKAGE USING THE SAME

(71) Applicant: SAMSUNG ELECTRONICS CO., LTD., Suwon-si, Gyeonggi-do (KR)

(72) Inventors: Soojae Park, Asan-si (KR); Geunwoo Kim, Asan-si (KR); Keunho Jang, Yongin-si (KR); Younjo Mun, Cheonan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 203 days.

(21) Appl. No.: 14/922,406

(22) Filed: Oct. 26, 2015

(65) Prior Publication Data

US 2016/0120032 A1 Apr. 28, 2016

(30) Foreign Application Priority Data

Oct. 27, 2014 (KR) ........................ 10-2014-0146277

(51) Int. Cl.
*H01L 21/56* (2006.01)
*H01L 23/00* (2006.01)
*H01L 23/13* (2006.01)
*H01L 21/50* (2006.01)
*H01L 23/498* (2006.01)

(52) U.S. Cl.
CPC ............ *H01L 21/565* (2013.01); *H01L 21/50* (2013.01); *H01L 21/561* (2013.01); *H01L 23/13* (2013.01); *H01L 24/97* (2013.01); *H01L 23/49838* (2013.01); *H01L 2224/16225* (2013.01); *H01L 2924/15311* (2013.01); *H01L 2924/181* (2013.01)

(58) Field of Classification Search
CPC .......................... H01L 21/565; H01L 2224/97
See application file for complete search history.

(56) References Cited

U.S. PATENT DOCUMENTS

| | | | |
|---|---|---|---|
| 6,025,641 | A | 2/2000 | Park |
| 6,835,897 | B2 | 12/2004 | Chang et al. |
| 6,864,434 | B2 | 3/2005 | Chang et al. |
| 6,888,238 | B1 | 5/2005 | Li |
| 6,914,646 | B2 | 7/2005 | Kim |
| 6,949,404 | B1 | 9/2005 | Fritz et al. |
| 7,595,255 | B2 | 9/2009 | Kim et al. |
| 8,014,154 | B2 | 9/2011 | Lee |

(Continued)

FOREIGN PATENT DOCUMENTS

| | | |
|---|---|---|
| JP | 2003-158143 | 5/2003 |
| JP | 2003-282809 | 10/2003 |

(Continued)

*Primary Examiner* — Lex Malsawma
*Assistant Examiner* — Xia Cross
(74) *Attorney, Agent, or Firm* — F. Chau & Associates, LLC

(57) ABSTRACT

A package frame includes a plurality of unit regions disposed on one surface of the package frame, a peripheral region surrounding the unit regions on the one surface, and a wrinkled structure disposed on the one surface in the peripheral region. A first surface of the wrinkled structure extends from the one surface and is disposed at a different level than the one surface. Each of the unit regions includes a plurality of conductive pads.

17 Claims, 27 Drawing Sheets

(56) References Cited

U.S. PATENT DOCUMENTS

| | | | |
|---|---|---|---|
| 8,313,984 B2 | 11/2012 | Topacio et al. | |
| 8,477,492 B2 | 7/2013 | Rothkopf et al. | |
| 8,591,692 B2 | 11/2013 | Wang et al. | |
| 8,703,535 B2 | 4/2014 | Kim et al. | |
| 8,866,296 B2 * | 10/2014 | Yamaji | H01L 21/568 257/739 |
| 2003/0178723 A1 * | 9/2003 | Ito | H01L 21/4878 257/735 |
| 2004/0147056 A1 | 7/2004 | McKinnell et al. | |
| 2007/0013324 A1 * | 1/2007 | Ubelein | B60J 1/17 318/34 |
| 2008/0002374 A1 | 1/2008 | Fukuzono et al. | |
| 2008/0280397 A1 * | 11/2008 | Kim | H01L 21/561 438/114 |
| 2012/0175756 A1 * | 7/2012 | Kim | H01L 23/4951 257/676 |

FOREIGN PATENT DOCUMENTS

| | | |
|---|---|---|
| JP | 2004-235638 | 8/2004 |
| KR | 1019970024058 | 5/1997 |
| KR | 100252051 | 1/2000 |
| KR | 1020130101192 | 9/2013 |

\* cited by examiner

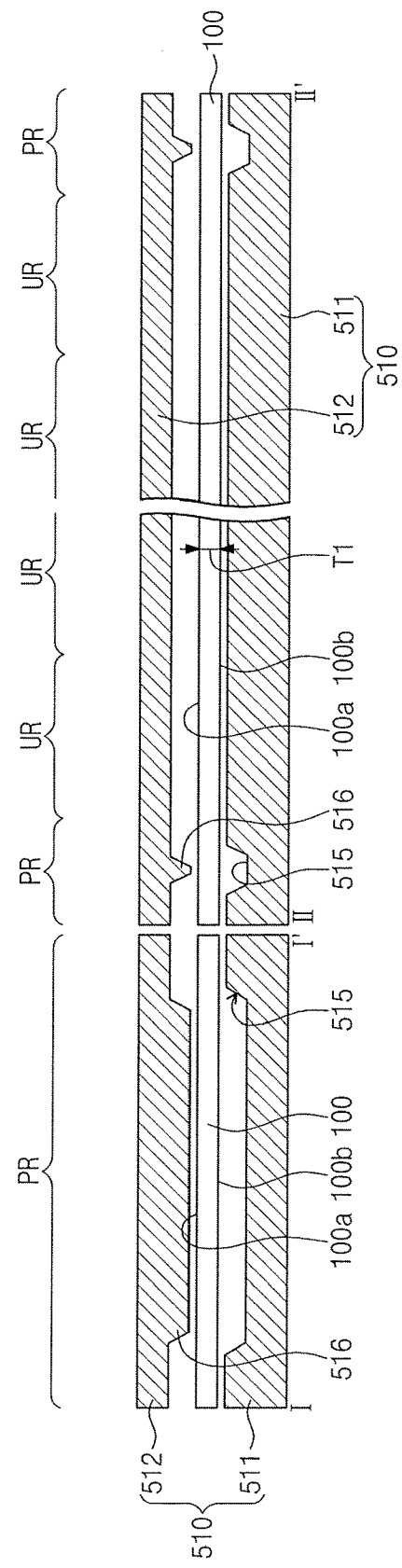

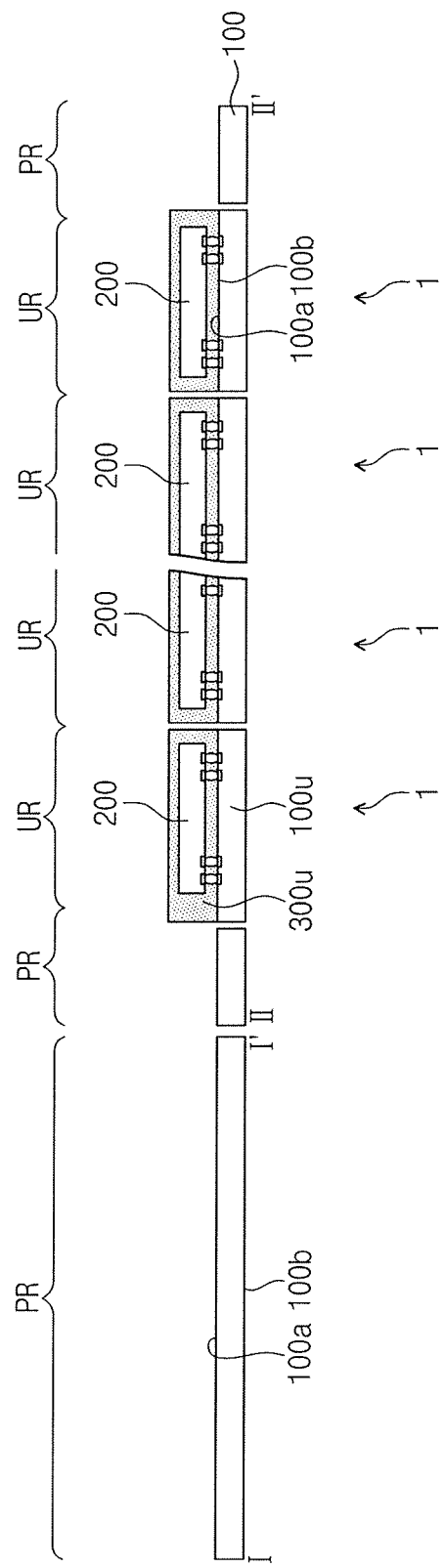

PACKAGE FRAME AND METHOD OF MANUFACTURING SEMICONDUCTOR PACKAGE USING THE SAME

CROSS-REFERENCE TO RELATED APPLICATIONS

This application claims priority under 35 U.S.C. § 119 to Korean Patent Application No. 10-2014-0146277, filed on Oct. 27, 2014, the disclosure of which is incorporated by reference herein in its entirety.

TECHNICAL FIELD

Exemplary embodiments of the present inventive concept relate to a semiconductor package frame. More particularly, exemplary embodiments of the inventive concept relate to a package frame and a method of fabricating a semiconductor package frame.

DISCUSSION OF THE RELATED ART

As semiconductor integrated circuits have become more integrated, the number of electrode terminals (e.g., pins) included on a semiconductor chip has been increased, and the pitch of the electrode terminals of the semiconductor chip has been reduced. To reduce the size of a semiconductor package, a printed circuit board may be used and the thickness of the printed circuit board may be reduced. However, as the thickness of the printed circuit board is reduced, the stiffness of the printed circuit board may decrease, resulting in a weaker printed circuit board.

SUMMARY

Exemplary embodiments of the inventive concept may provide a package frame with improved stiffness and a method of manufacturing the semiconductor package with the improved stiffness.

Exemplary embodiments of the inventive concepts may further provide a package frame capable of improving reliability of a semiconductor package.

According to an exemplary embodiment of the inventive concept, a package frame includes a plurality of unit regions disposed on one surface of the package frame, a peripheral region surrounding the unit regions on the one surface, and a wrinkled structure disposed on the one surface in the peripheral region. A first surface of the wrinkled structure extends from the one surface and is disposed at a different level than the one surface, and each of the unit regions includes a plurality of conductive pads.

In an exemplary embodiment, the wrinkled structure includes a second surface extending from another surface of the package frame. The second surface of the wrinkled structure is disposed at a different level than the another surface and the another surface opposes the one surface.

In an exemplary embodiment, the first surface of the wrinkled structure is recessed from the one surface, and the second surface of the wrinkled structure protrudes from the another surface.

In an exemplary embodiment, a distance between the first surface and the second surface is substantially equal to a distance between the one surface and the another surface.

In an exemplary embodiment, the wrinkled structure is inclined, and the one surface disposed at one side of the wrinkled structure is lower than the one surface disposed at another side of the wrinkled structure.

In an exemplary embodiment, the wrinkled structure extends lengthwise in a first direction and has a uniform thickness along the first direction.

In an exemplary embodiment, the wrinkled structure includes a plurality of wrinkled structures and thicknesses of the plurality of wrinkled structures are substantially equal to each other.

According to an exemplary embodiment of the inventive concept, a package frame includes a plurality of unit regions disposed on one surface of the package frame, a peripheral region surrounding the unit regions on the one surface, and a wrinkled structure disposed on the one surface in the peripheral region. A first surface of the wrinkled structure extends from the one surface and is disposed at a different level than the one surface. The wrinkled structure includes a plurality of wrinkled structures, and the plurality of wrinkled structures are disposed between a first side of the one surface and the unit regions.

According to an exemplary embodiment of the inventive concept, a package frame includes a plurality of unit regions disposed on one surface of the package frame, and a wrinkled structure laterally spaced apart from the unit regions on the one surface. A first surface of the wrinkled structure extends from the one surface and is disposed at a different level than the one surface. Each of the unit regions includes chip region and a molding region surrounding the chip region. The unit regions are not overlapped with the wrinkled structure in a plan view.

In an exemplary embodiment, a thickness of the wrinkled structure is substantially equal to a thickness of the package frame in the unit regions.

In an exemplary embodiment, the wrinkled structure is recessed from the one surface and protrudes from another surface of the package frame that opposes the one surface.

In an exemplary embodiment, the wrinkled structure includes a first wrinkled structure disposed between a first side of the one surface and the unit regions, and a second wrinkled structure disposed between a second side of the one surface and the unit regions. The second side opposes the first side and is substantially parallel to a short axis of the one surface.

According to an exemplary embodiment of the inventive concept, a package frame includes a plurality of unit regions disposed on one surface of the package frame, and a wrinkled structure laterally spaced apart from the unit regions on the one surface. A first surface of the wrinkled structure extends from the one surface and is disposed at a different level than the one surface. Each of the unit regions includes a chip region and a molding region surrounding the chip region, and the wrinkled structure is disposed between the unit regions.

According to an exemplary embodiment of the inventive concept, a method of manufacturing a semiconductor package includes mounting a plurality of semiconductor chips on a package frame of the semiconductor package. The semiconductor package frame includes one surface, a plurality of unit regions disposed on the one surface, and a peripheral region surrounding the unit regions on the one surface. Each unit region includes a chip region and a molding region surrounding the chip region, and the semiconductor chips are mounted in the chip regions. The method further includes forming a molding layer covering the semiconductor chips on the package frame, and separating the unit regions from each other. The package frame includes a wrinkled structure disposed in the peripheral region on the one surface of the package frame.

In an exemplary embodiment, the one surface and another surface opposing the one surface and disposed in the peripheral region are bent to form the wrinkled structure.

In an exemplary embodiment, the wrinkled structure is laterally spaced apart from the unit regions and not overlapped with the unit regions in a plan view, and a first surface of the wrinkled structure extends from the one surface and is disposed at a different level than the one surface.

In an exemplary embodiment, forming the molding layer includes placing the package frame in a mold having a cavity, and pressing the mold to remove the wrinkled structure. The unit regions are disposed in the cavity and the wrinkled structure contacts the mold upon placing the package frame in the mold.

In an exemplary embodiment, the wrinkled structure is formed between one side of the one surface and the unit regions.

According to an exemplary embodiment of the inventive concept, a method of manufacturing a substrate includes forming a wrinkled structure on one surface of the substrate. The substrate includes a plurality of unit regions disposed on the one surface and a peripheral region surrounding the unit regions on the one surface, and the wrinkled structure is formed by applying a physical force to the one surface of the substrate in the peripheral region. The wrinkled structure extends from the one surface to a different plane than the one surface, and the wrinkled structure is formed between the unit regions.

In an exemplary embodiment, forming the wrinkled structure includes placing the substrate in a mold having grooves, and pressing the mold to bend the substrate in the peripheral region. The peripheral region is disposed on the grooves upon placing the substrate in the mold.

According to an exemplary embodiment of the inventive concept, a package frame includes a plurality of unit regions disposed on one surface of the package frame, a peripheral region surrounding the unit regions on the one surface, a plurality of semiconductor chips disposed on the one surface only in the unit regions, and a wrinkled structure disposed on the one surface only in the peripheral region. The wrinkled structure includes a first surface and a second surface opposing the first surface. The first surface of the wrinkled structure extends downward from the one surface and is recessed from the one surface. The second surface of the wrinkled structure extends downward from another surface of the package frame and protrudes from the another surface. The another surface opposes the one surface.

BRIEF DESCRIPTION OF THE DRAWINGS

The above and other features of the present inventive concept will become more apparent by describing exemplary embodiments thereof with reference to the accompanying drawings, in which:

FIGS. 4A to 7A are plan views illustrating a method of manufacturing a semiconductor package according to exemplary embodiments of the inventive concept.

FIGS. 4B to 7B are cross-sectional views taken along lines I-I' and II-II' of FIGS. 4A to 7A, respectively, according to exemplary embodiments of the inventive concept.

DETAILED DESCRIPTION OF THE EXEMPLARY EMBODIMENTS

Figure 1:
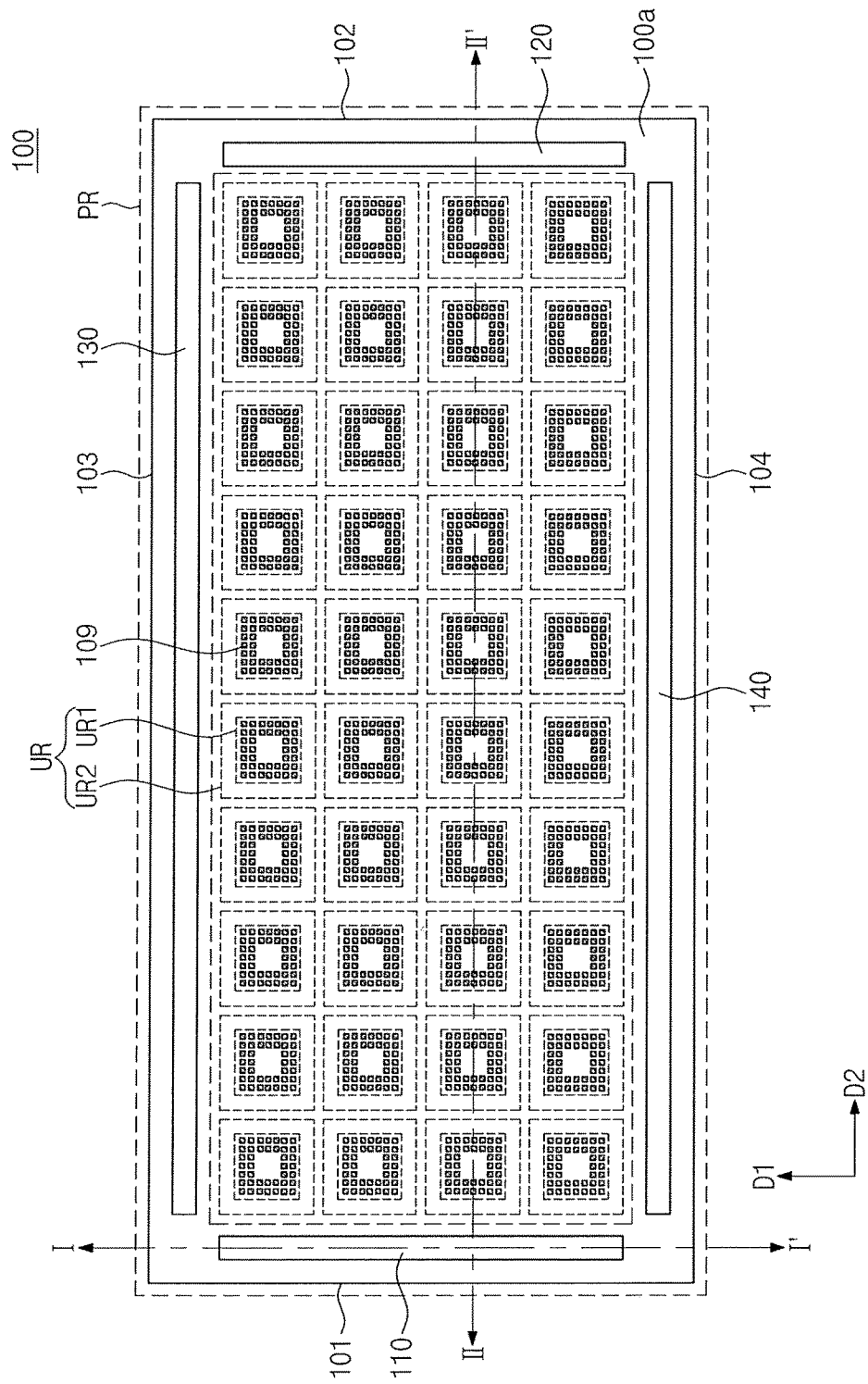
FIG. 1 is a plan view illustrating a package frame according to an exemplary embodiment of the inventive concept.

Exemplary embodiments of the inventive concept will be described more fully hereinafter with reference to the accompanying drawings. In the drawings, the size and relative sizes of layers and regions may be exaggerated for clarity. Like reference numerals may refer to like elements throughout the accompanying drawings.

As used herein, the singular terms "a," "an" and "the" are intended to include the plural forms as well, unless the context clearly indicates otherwise. As used herein, the term "and/or" includes any and all combinations of one or more of the associated listed items.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component.

Herein, when two or more elements or values are described as being substantially the same as or equal to each other, it is to be understood that the elements or values are identical to each other, indistinguishable from each other, or distinguishable from each other but functionally the same as each other as would be understood by a person having ordinary skill in the art. Further, when a first region is described as surrounding a second region, it is to be understood that the first region may entirely or partially surround the second region.

Additionally, the exemplary embodiments will be described with sectional views as ideal exemplary views of the exemplary embodiments. Accordingly, shapes of the exemplary views may be modified according to manufacturing techniques and/or allowable errors. Therefore, the exemplary embodiments of the inventive concept are not limited to the specific shapes illustrated in the exemplary views, but may include other shapes that may be created according to manufacturing processes.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, may occur. Thus, exemplary embodiments should not be construed as limited to the shapes of regions illustrated herein but are to include deviations in shapes that result, for example, from manufacturing. For example, an etching region illustrated as a rectangle may have rounded or curved features. Thus, the regions illustrated in the figures are schematic in nature and their shapes are not intended to limit the scope of exemplary embodiments.

Devices and methods of forming devices according to various exemplary embodiments described herein may be embodied in microelectronic devices such as, for example, integrated circuits, in which a plurality of devices according to various exemplary embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various exemplary embodiments described herein may include a plurality of the devices in an array and/or in a two-dimensional pattern that is based on the functionality of the microelectronic device.

The devices according to various exemplary embodiments described herein may be interspersed among other devices depending on the functionality of the microelectronic device. Moreover, microelectronic devices according to various exemplary embodiments described herein may be replicated in a third direction that may be orthogonal to the two different directions, to provide three-dimensional integrated circuits.

Accordingly, the cross-sectional view(s) illustrated herein provide support for a plurality of devices according to various exemplary embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a plan view illustrating a package frame according to an exemplary embodiment of the inventive concept. FIGS. 2A to 2E are cross-sectional views taken along line II-II' of FIG. 1 illustrating package frames according to exemplary embodiments of the inventive concept. FIGS. 3A to 3D are cross-sectional views taken along line I-I' of FIG. 1 illustrating package frames according to exemplary embodiments of the inventive concept.

Referring to FIG. 1, a package frame 100 may be a printed circuit board (PCB) having circuit patterns. One surface 100a of the package frame 100 may have a long axis (e.g., corresponding to a longer side) and a short axis (e.g., corresponding to a shorter side) that are perpendicular to each other. The short axis may extend in a first direction D1, and the long axis may extend in a second direction D2. The one surface 100a of the package frame 100 may be covered with a polymer such as, for example, a solder-resist. The package frame 100 may have a thickness of about 0.4 mm or less. For example, according to exemplary embodiments, the package frame 100 may have a thickness of about 0.1 mm or less or may have a thickness in a range of about 0.01 mm to about 0.1 mm. However, exemplary embodiments of the inventive concept are not limited thereto.

Figure 7A:
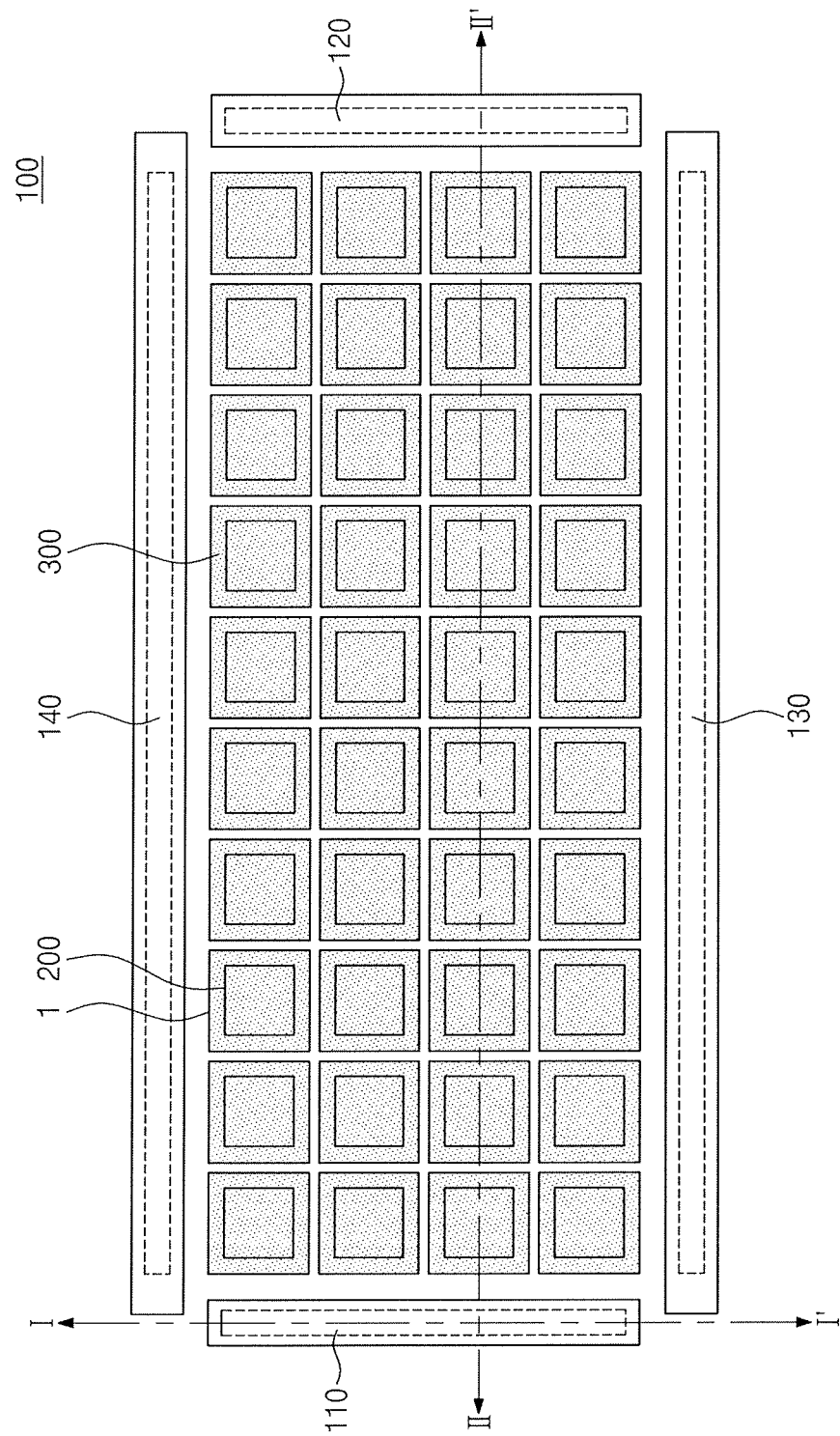

Unit regions UR and a peripheral region PR may be provided on the one surface 100a of the package frame 100. Each of the unit regions UR correspond to a region in which a semiconductor package 1 of FIGS. 7A and 7B is formed. The peripheral region PR corresponds to a region in which the semiconductor package 1 is not formed. The unit regions UR may be provided in a region corresponding to a core of the package frame 100.

Figure 6A:
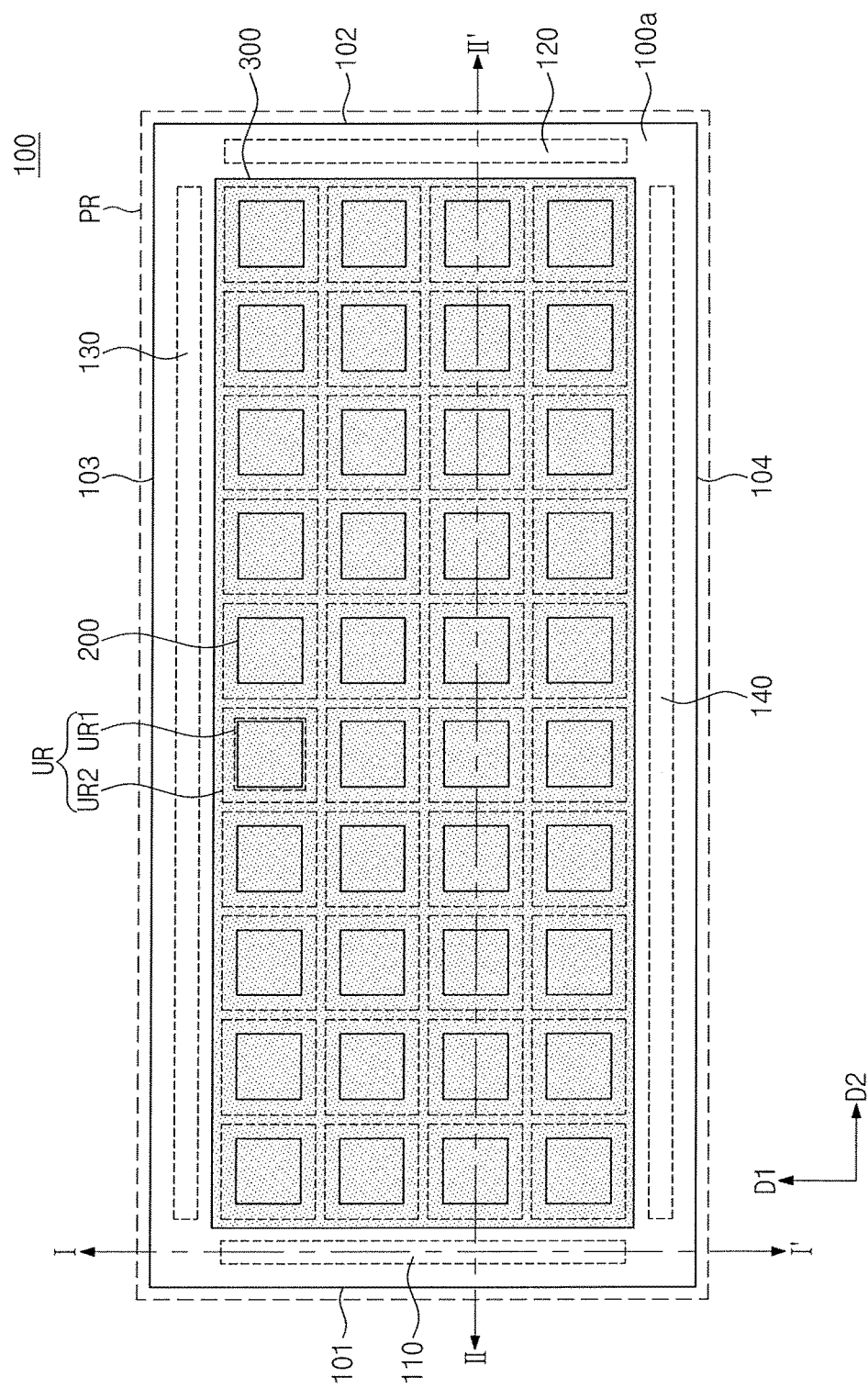
FIG. 6AA illustrates cross-sectional views taken along lines I-I' and II-II' of FIG. 1 according to exemplary embodiments of the inventive concept.
Figure 6A:
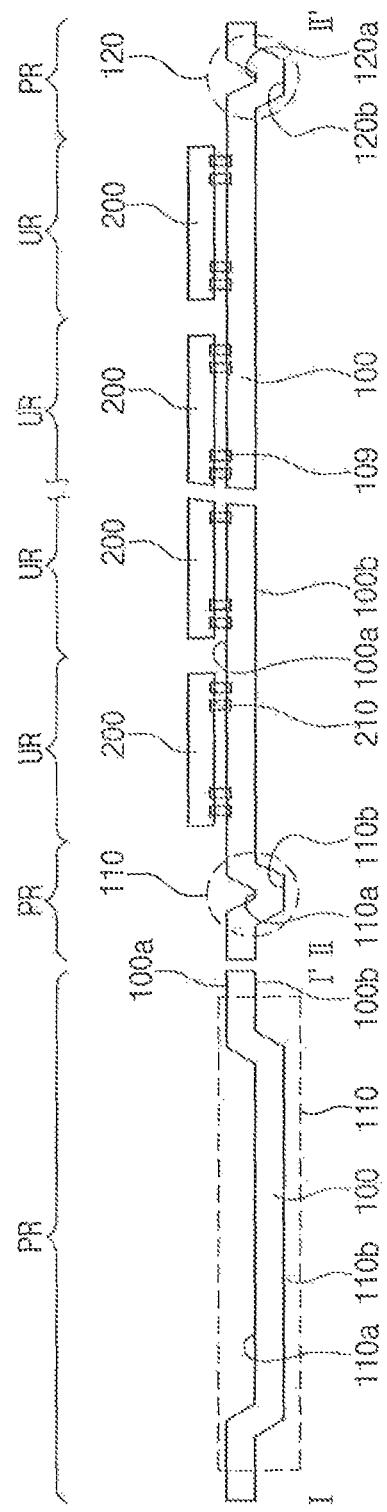
Figure 6B:
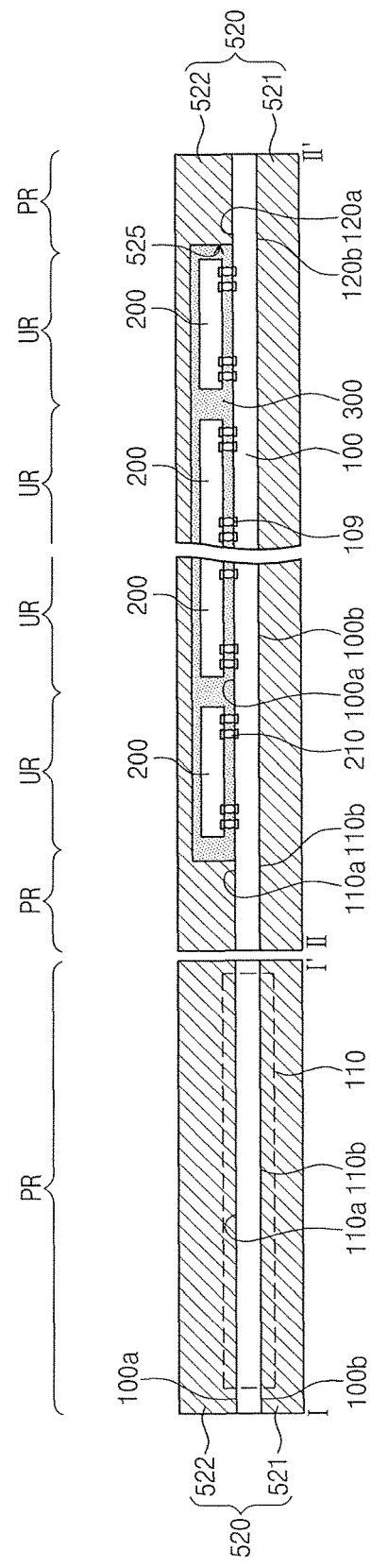

Each of the unit regions UR may include a chip region UR1 and a molding region UR2 surrounding the chip region UR1. The chip region UR1 corresponds to a region in which a semiconductor chip 200 of FIGS. 6A and 6B is disposed. When viewed from a plan view, the chip regions UR1 may be arranged to correspond to the unit regions UR. Each of the unit regions UR may include a plurality of pads 109. The pads 109 may include a conductive material (e.g., a metal). The pads 109 may be variously arranged. For example, the pads 109 may be disposed in the chip region UR1 or the molding region UR2.

The peripheral region PR may surround the unit regions UR and may be provided in a region corresponding to an edge of the one surface 100a. For example, the peripheral region PR may be provided between the unit regions UR and four sides 101, 102, 103, and 104 of the one surface 100a. A first side 101 and a second side 102 may extend in the first direction D1, and the second side 102 may be opposite to the first side 101. A third side 103 and a fourth side 104 may extend in the second direction D2, and the fourth side 104 may be opposite to the third side 103. The ends of the third side 103 may be connected to first ends of the first and second sides 101 and 102, respectively, and the ends of the fourth side 104 may be connected to second ends of the first and second sides 101 and 102, respectively. However, exemplary embodiments of the inventive concept are not limited to the peripheral region PR being provided at the edge of the one surface 100a. For example, In exemplary embodiments, the planar position of the peripheral region PR may be modified in various ways, for example, as described below with reference to FIG. 9H.

Wrinkled structures 110, 120, 130, and 140 may be provided in the peripheral region PR and may be laterally spaced apart from the unit regions UR. For example, first, second, third, and fourth wrinkled structures 110, 120, 130, and 140 may be provided between the first, second, third, and fourth sides 101, 102, 103, and 104 of the one surface 100a and the unit regions UR, respectively. In exemplary embodiments, at least one of the first to fourth wrinkled structures 110, 120, 130, and 140 may be omitted. Hereinafter, the wrinkled structures according to exemplary embodiments of the inventive concept will be described in more detail.

As illustrated in FIGS. 2A to 2E, according to exemplary embodiments, the package frame 100 may have the one surface 100a and another surface 100b opposite to the one surface 100a. Herein, the one surface 100a may also be referred to as a first surface 100a, and the another surface 100b, which opposes the first surface 100a, may be referred to as a second surface 100b. The first wrinkled structure 110 may have a first surface 110a and a second surface 110b opposite to each other, and the second wrinkled structure 120 may have a first surface 120a and a second surface 120b opposite to each other. The first surfaces 110a and 120a of the first and second wrinkled structures 110 and 120 may extend (e.g., extend downward) from the one surface 100a of the package frame 100. At least portions of the first surfaces 110a and 120a may be provided in a plane different than the one surface 100a. For example, at least portions of the first surfaces 110a and 120a may be disposed at a different level from the one surface 100a (e.g., the first surfaces 110a and 120a may have a different height than the one surface 120a). In an exemplary embodiment, the first surfaces 110a and 120a may be recessed below the one surface 100a. The second surfaces 110b and 120b of the first and second wrinkled structures 110 and 120 may extend (e.g., extend downward) from the another surface 100b of the package frame 100. At least portions of the second surfaces 110b and 120b of the first and second wrinkled structures 110 and 120 may be provided in a plane different from the another surface 100b of the package frame 100. The second surfaces 110b and 120b may have structures corresponding to structures of the first surfaces 110a and 120a. For example, the second surfaces 110b and 120b may be spaced apart from the first surfaces 110a and 120a at a uniform distance, respectively. The first surfaces 110a and 120a may be recessed from the one surface 100a of the package frame 100, and the second surfaces 110b and 120b may protrude from the another surface 100b of the package frame 100. Alternatively, the first surfaces 110a and 120a may protrude from the one surface 100a (e.g., the first surfaces 110a and 120a may extend upward from the one surface 100a), and the second surfaces 110b and 120b may be recessed from the another surface 100b (e.g., the second surfaces 110b and 120b may extend upward from the another surface 100b). As illustrated in FIGS. 2A to 2E, a thickness T2 of the first wrinkled structure 110 may be substantially equal to a thickness T3 of the second wrinkled structure 120. The thicknesses T2 and T3 of the wrinkled structures 110 and 120 may be substantially equal to a thickness T1 of the package frame 100 of the unit region UR. For example, the distance between the first and second surfaces 110a and 110b and the distance between the first and second surfaces 120a and 120b may be substantially equal to the distance between the one surface 100a and the another surface 100b. The substantially equal thicknesses may include a tolerance of a thickness in a state that an additional etching process is not performed. According to exemplary embodiments, the first and second surfaces 110a and 110b of the first wrinkled structure 110 may have the substantially same shapes and the substantially same levels (e.g., heights) as the first and second surfaces 120a and 120b of the second wrinkled structure 120. However, exemplary embodiments of the inventive concept are not limited thereto.

According to exemplary embodiments, shapes of the third and fourth wrinkled structures 130 and 140 may be substantially the same as those of the first and second wrinkled structures 110 and 120. Further, according to exemplary embodiments, thicknesses of the third and fourth wrinkled structures 130 and 140 may be substantially equal to the thickness T1 of the package frame 100 in the unit region UR and the thicknesses T2 and T3 of the first and second wrinkled structures 110 and 120.

Figure 2A:
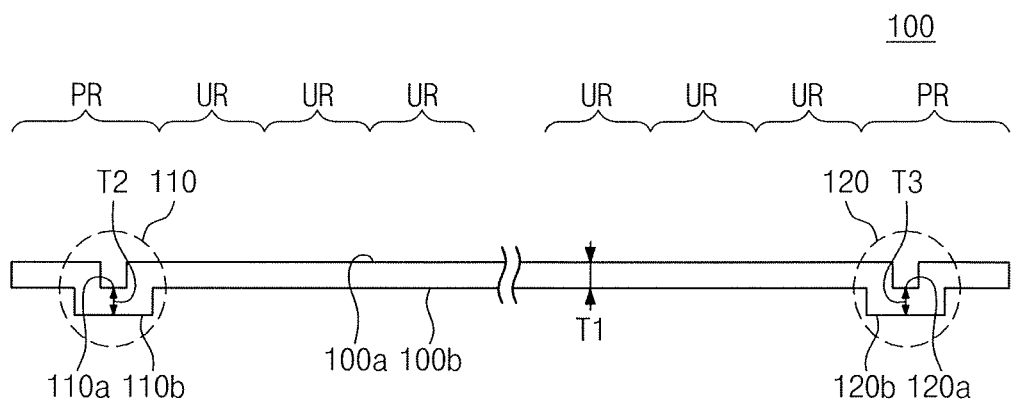
FIGS. 2A to 2E are cross-sectional views taken along line II-II' of FIG. 1 illustrating package frames according to exemplary embodiments of the inventive concept.
Figure 2B:
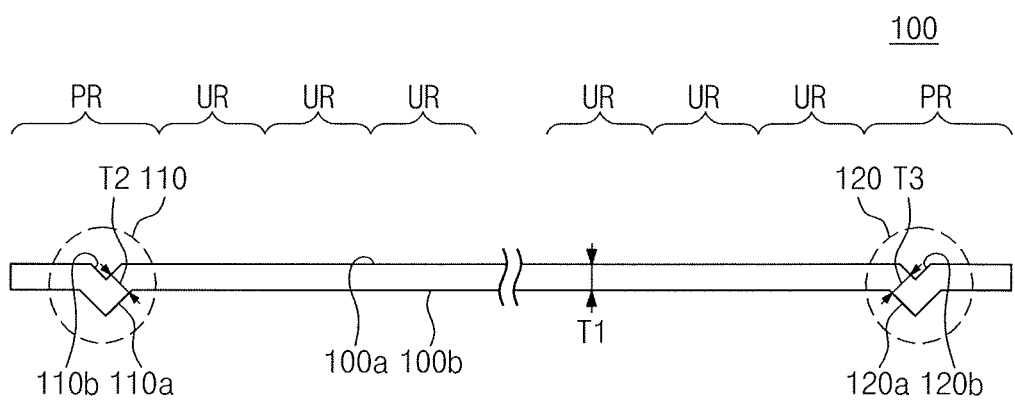
Figure 2C:
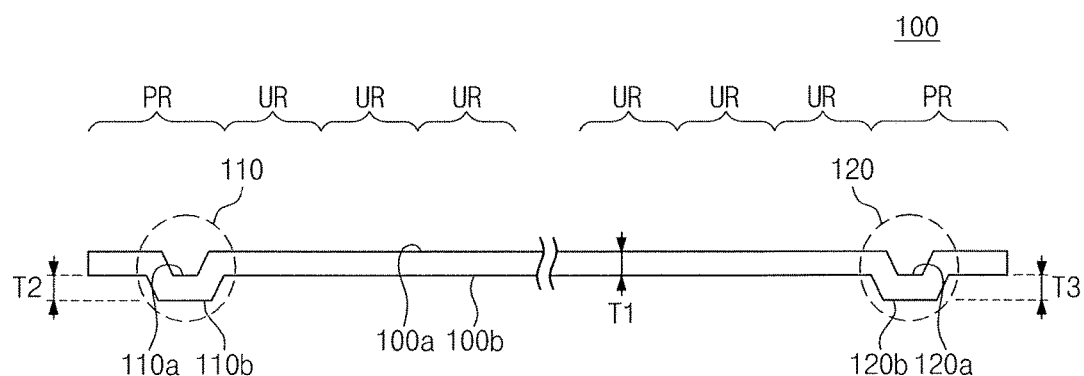

As illustrated in FIGS. 2A to 2C, the first and second wrinkled structures 110 and 120 may have angular cross-sections. For example, in an exemplary embodiment of FIG. 2A, each of the first and second surfaces 110a, 110b, 120a, and 120b of the first and second wrinkled structures 110 and 120 may have a quadrilateral cross-section (e.g., a rectangular cross-section). For example, each of the first and second wrinkled structures 110 and 120 may include portions substantially vertical to the one surface 100a and a portion substantially parallel to the one surface 100a and connecting the vertical portions.

In an exemplary embodiment of FIG. 2B, each of the first and second wrinkled structures 110 and 120 may have a triangular cross-section. For example, the first surfaces 110a and 120a may include portions inclined with respect to the one surface 100a, and the second surfaces 110b and 120b may include portions inclined with respect to the another surface 100b. The inclined portions of each of the first and second surfaces 110a, 120a, 110b, and 120b may meet each other to constitute a sharp shape (e.g., an angular shape having a sharp corner at which the inclined portions meet).

In an exemplary embodiment of FIG. 2C, each of the first and second wrinkled structures 110 and 120 may have a polygonal cross-section. Each of the first surfaces 110a and 120a may include portions inclined with respect to the one surface 100a and a flat portion. The flat portion may be substantially parallel to the one surface 100a and may connect ends of the inclined portions. Each of the second surfaces 110b and 120b may have a shape corresponding to that of each of the first surfaces 110a and 120a. For example, each of the second surfaces 110b and 120b may include portions inclined with respect to the another surface 100b and a flat portion.

Figure 2D:
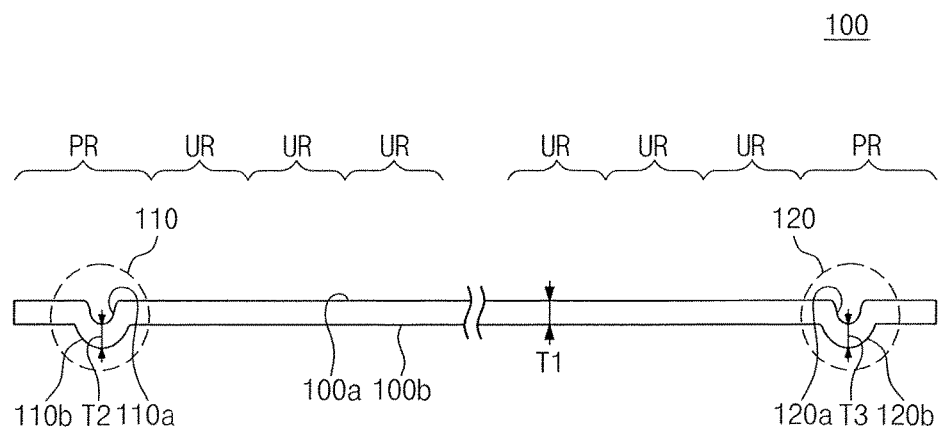

In an exemplary embodiment of FIG. 2D, each of the first and second wrinkled structures 110 and 120 may have a rounded cross-section. For example, each of the first and second surfaces 110a, 120a, 110b and 120b of the first and second wrinkled structures 110 and 120 may have an arc shape. The second surfaces 110b and 120b may be spaced apart from the first surfaces 110a and 120a at a uniform distance, respectively. The second surfaces 110b and 120b may have shapes corresponding to those of the first surfaces 110a and 120a, respectively.

Figure 2E:
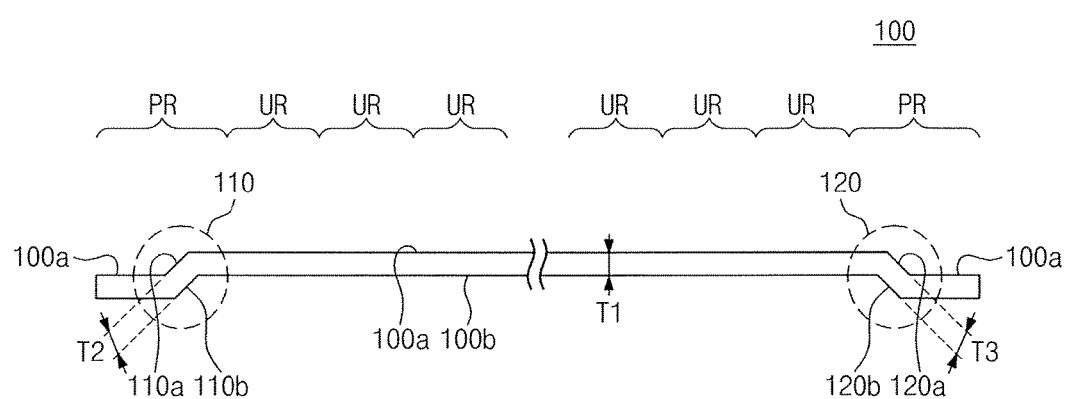

In an exemplary embodiment of FIG. 2E, each of the first and second wrinkled structures 110 and 120 may have an inclined cross-section. A cross-section of the package frame 100 may have a step difference by the first and second wrinkled structures 110 and 120. For example, the one surface 100a at a side of the first wrinkled structure 110 may be lower than the one surface 100a at another side of the second wrinkled structure 110. The second wrinkled structure 120 may have a shape corresponding to that of the first wrinkled structure 110. For example, the first and second wrinkled structures 110 and 120 may be symmetrical.

Figure 3A:
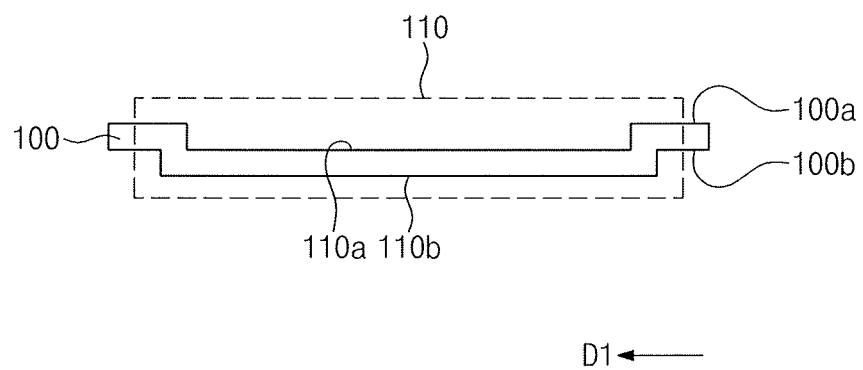
FIGS. 3A to 3D are cross-sectional views taken along line I-I' of FIG. 1 illustrating package frames according to exemplary embodiments of the inventive concept.
Figure 3B:
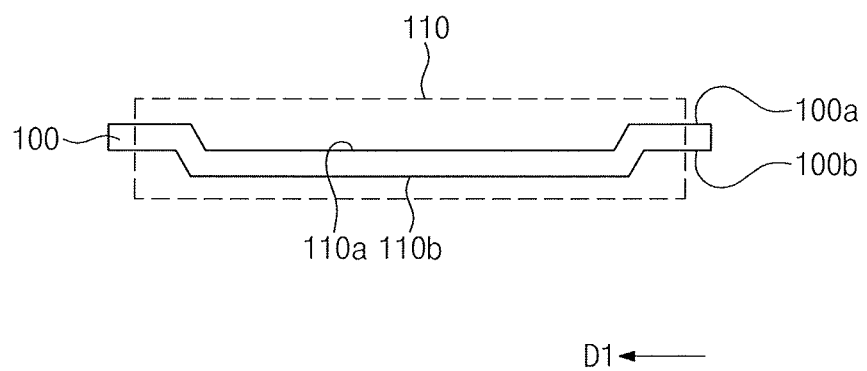
Figure 3C:
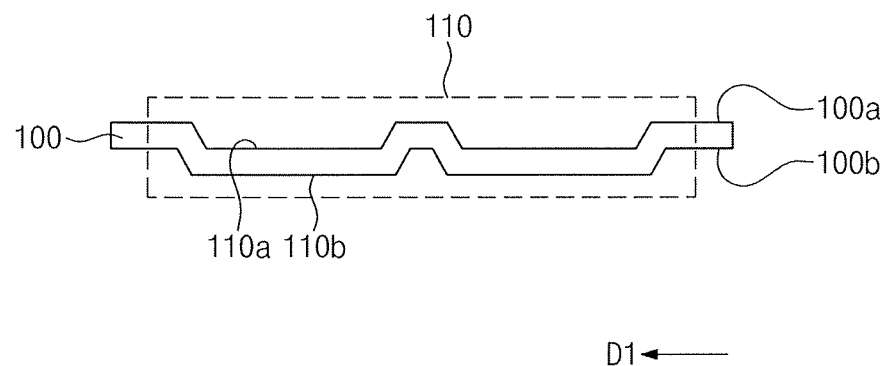
Figure 3D:
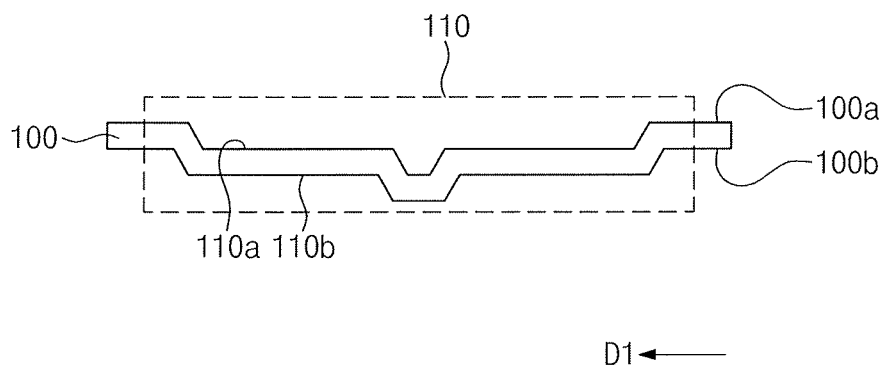

As illustrated in FIGS. 3A to 3D, the second surface 110b may be spaced apart from the first surface 110a at a uniform distance. Thus, the first wrinkled structure 110 may extend along the first direction D1 with a uniform thickness. Each of the second to fourth wrinkled structures 120, 130, and 140 may extend with a uniform thickness. In an exemplary embodiment of FIG. 3A, each of the first and second surfaces 110a and 110b of the first wrinkled structure 110 may have a quadrilateral cross-section (e.g., a rectangular cross-section). Alternatively, as illustrated in FIGS. 3B to 3D, the first and second surfaces 110a and 110b of the first wrinkled structure 110 may include a combination of at least one recessed portion and at least one protruding portion. The first surface 110a of the first wrinkled structure 110 may be substantially parallel and/or inclined with respect to the one surface 100a of the package frame 100. The second surface 110b of the first wrinkled structure 110 may be substantially parallel and/or inclined with respect to the another surface 100b of the package frame 100. However, the cross-section of the first wrinkled structure 110 is not limited thereto. For example, in exemplary embodiments, the cross-section of the first wrinkled structure 110 may have one of other various shapes.

A method of manufacturing a semiconductor package according to exemplary embodiments of the inventive concept will be described hereinafter.

FIGS. 4A to 7A are plan views illustrating a method of manufacturing a semiconductor package according to exemplary embodiments of the inventive concept. FIGS. 4B to 7B are cross-sectional views taken lines I-I' and II-IF of FIGS. 4A to 7A, respectively, according to exemplary embodiments of the inventive concept. FIG. 4C is a schematic diagram illustrating a mold apparatus used for a process of forming a wrinkled structure according to exemplary embodiments of the inventive concept. Hereinafter, for convenience of explanation, a further description of elements and processes previously described may be omitted.

Figure 4A:
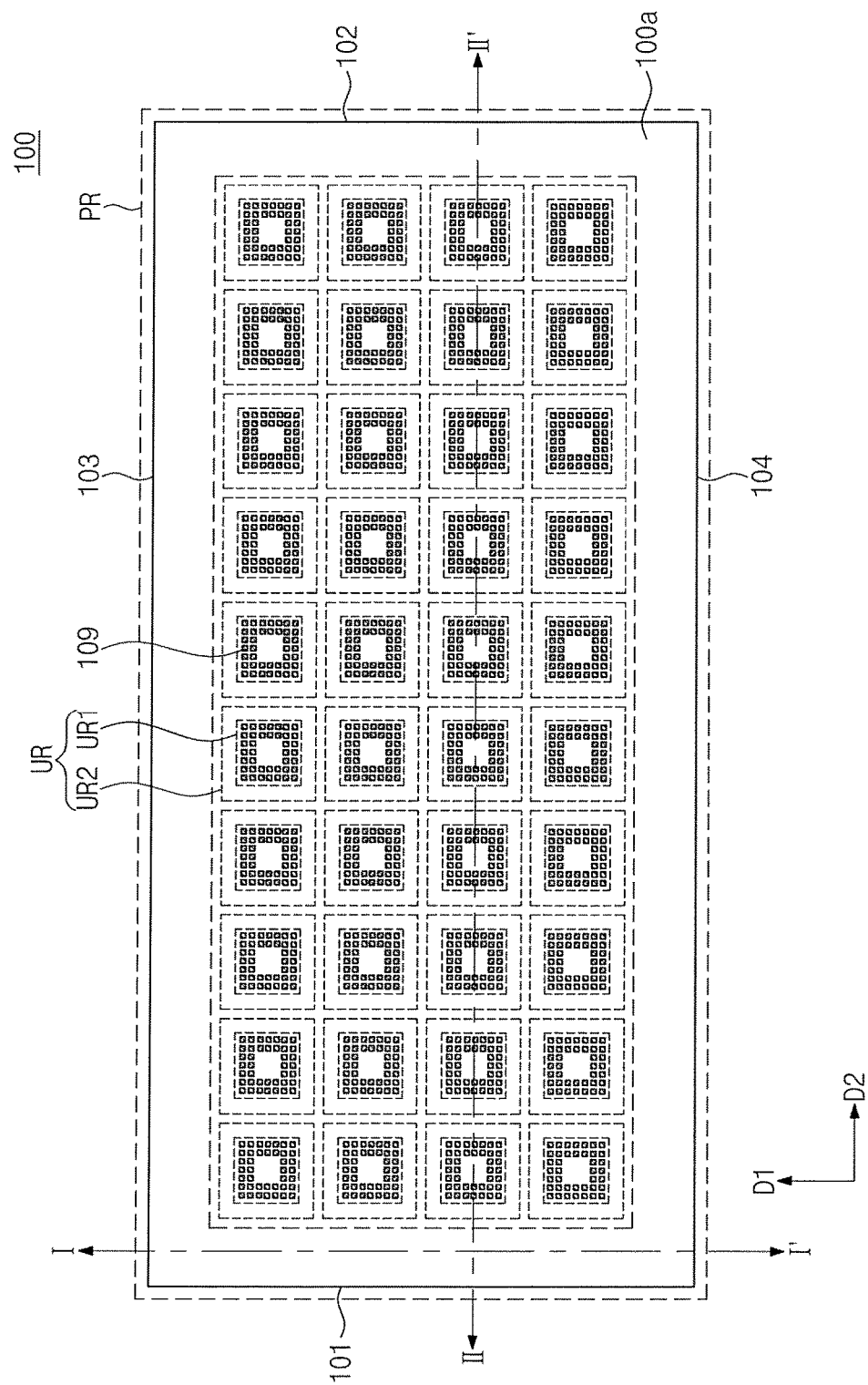

Referring to FIGS. 4A and 4B, a package frame 100 including unit regions UR and a peripheral region PR may be prepared. Each of the unit regions UR may include a chip region UR1 and a molding region UR2, as described with reference to FIG. 1. Pads 109 may be provided in the unit regions UR. The peripheral region PR may surround the unit regions UR when viewed from a plan view. As illustrated in FIG. 4B, one surface 100a and another surface 100b of the package frame 100 of the unit regions UR and the peripheral region PR may be substantially flat. A thickness of the package frame 100 in the unit region UR may be substantially equal to a thickness of the package frame 100 in the peripheral region PR.

As illustrated in FIG. 4B, the package frame 100 may be located in a first mold 510 having grooves 515. The first mold 510 may include a first plate 511 and a second plate 512 disposed over the first plate 511. A top surface of the first plate 511 may have the grooves 515, and a bottom surface of the second plate 512 may have protrusions 516. The grooves 515 of the top surface of the first plate 511 may overlap with the protrusions 516 of the bottom surface of the second plate 512. At this time, the peripheral region PR of the package frame 100 may be disposed on the grooves 515 of the first plate 511, and the package frame 100 of the unit regions UR may be laterally spaced apart from the grooves 515 of the first plate 511. The package frame 100 of the unit regions UR may be disposed on a flat top surface of the first plate 511.

Figure 4C:
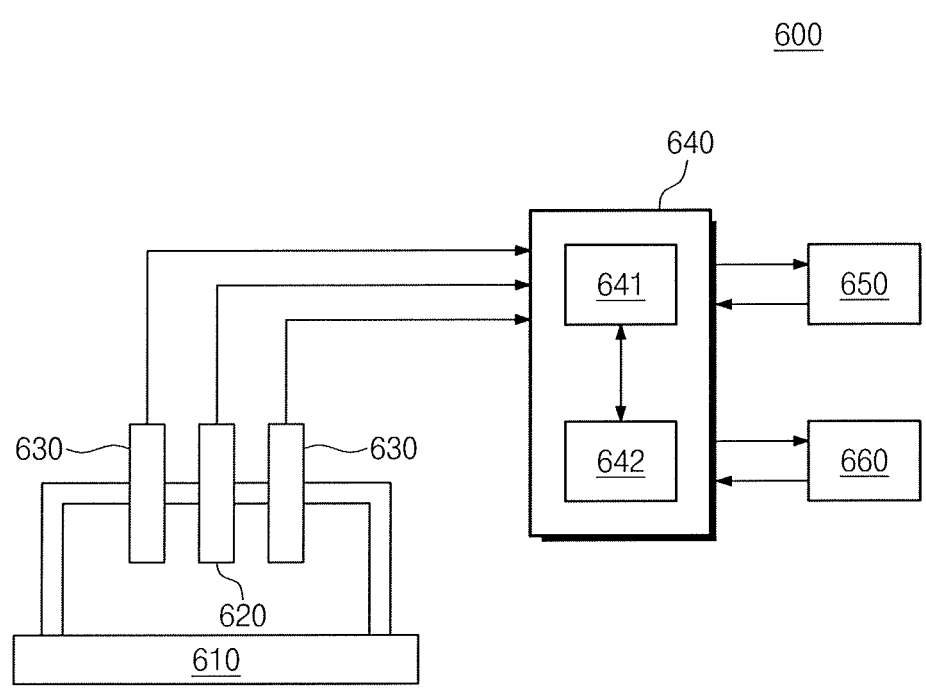
FIG. 4C is a schematic diagram illustrating a mold apparatus used for a process of forming a wrinkled structure according to exemplary embodiments of the inventive concept.

FIG. 4C is a schematic diagram illustrating a mold apparatus used for a process of forming a wrinkled structure according to exemplary embodiments of the inventive concept.

Referring to FIG. 4C, a mold apparatus 600 may include a die 610, a first pressure unit 620, a second pressure unit 630, a controller 640, an input unit 650, and an interface unit 660. The first and second pressure units 620 and 630 may be disposed over the die 610. According to exemplary embodiments, the first pressure unit 620 may include, for example, a compressor, a probe, a valve, and a pressure sensor, and the second pressure unit 630 may include, for example, a cylinder, a valve, and a pressure sensor. The controller 640 may include an operation controller 641 and a programmable logic controller (PLC) 642. The controller 640 may receive a signal from the input unit 650 and/or the interface unit 660 and may control operations of the first and second pressure units 620 and 630. The interface unit 660 may include, for example, a human-machine interface (HMI) unit.

Figure 5A:
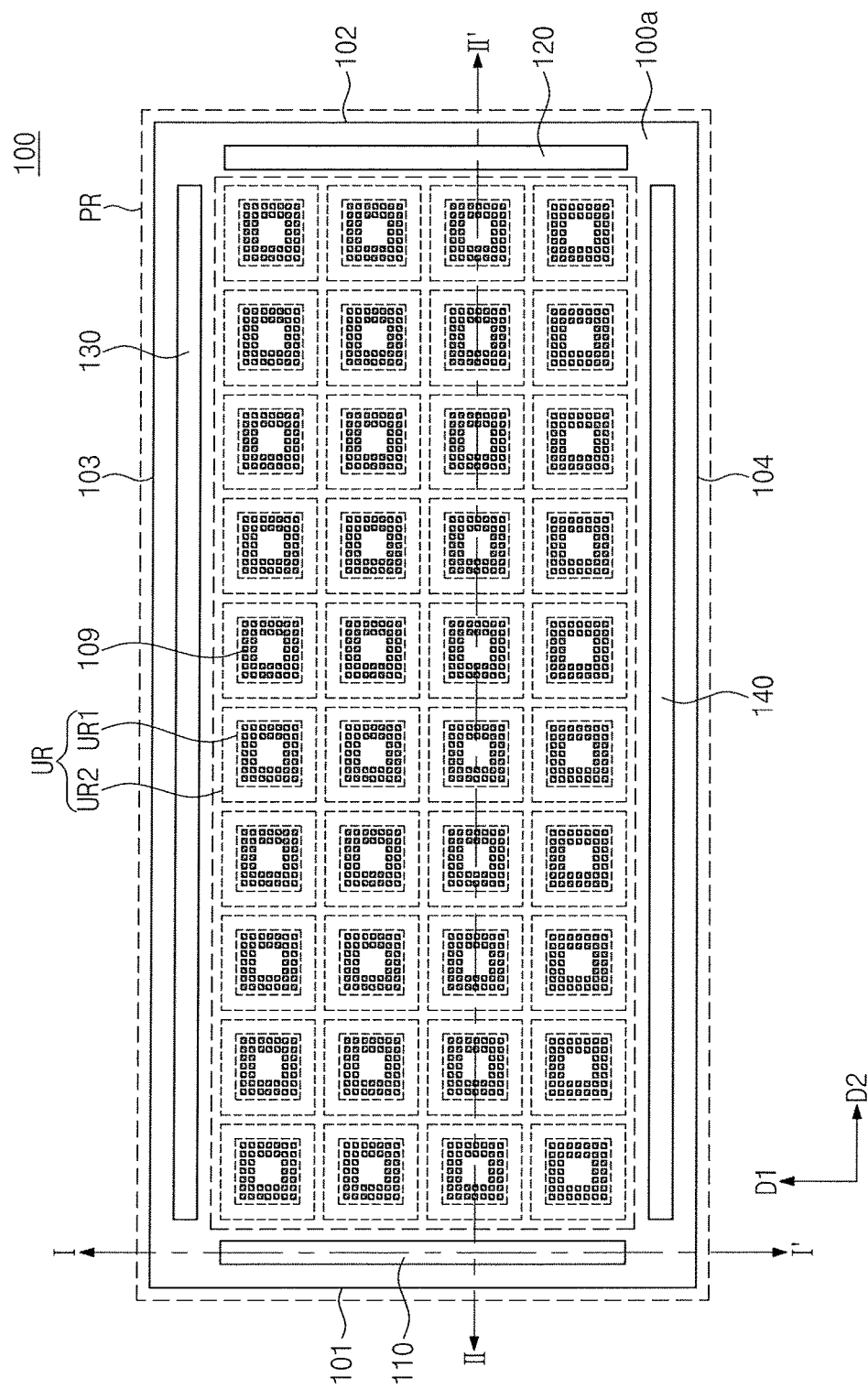
Figure 5B:
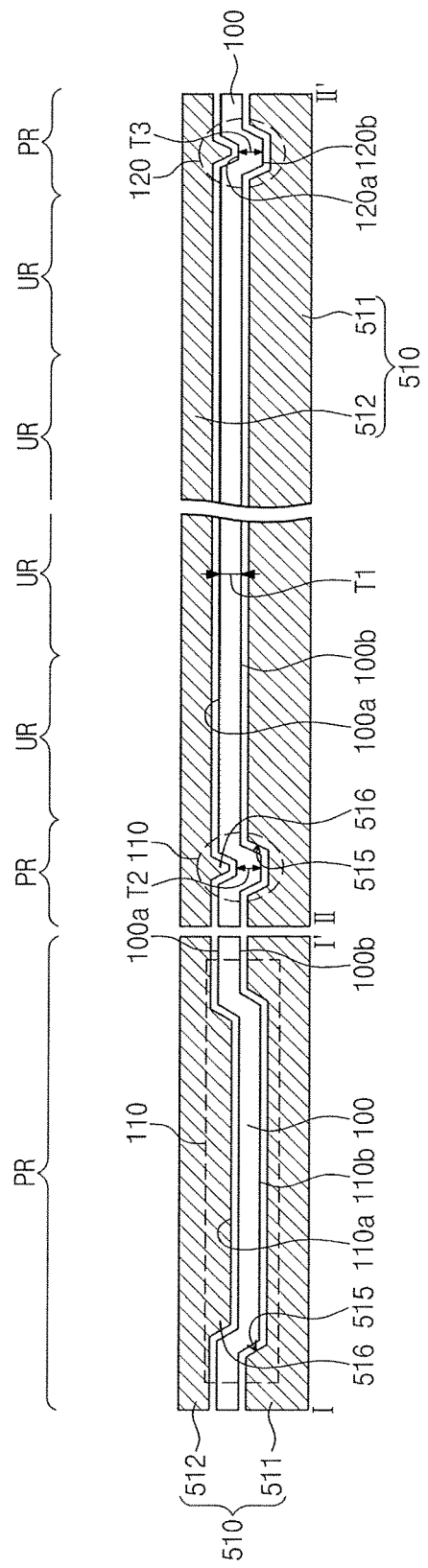

Referring to FIGS. 4C, 5A, and 5B, physical force may be applied to the first mold 510 to form wrinkled structures 110, 120, 130, and 140 in the package frame 100 in the peripheral region PR (e.g., the first mold 510 may be pressed to bend the package frame 100 in the peripheral region PR). For example, the first mold 510 having the package frame 100 may be loaded on the die 610 of the mold apparatus 600. The first and second pressure units 620 and 630 may apply the physical force to the first mold 510 in response to receiving the signal from the controller 640. The first mold 510 may transmit the physical force to the package frame 100 to form the first to fourth wrinkled structures 110, 120, 130, and 140. For example, the physical force may be applied to the one surface 100a of the package frame 100 in the peripheral region PR to form any of the first to fourth wrinkled structures 110, 120, 130, and 140. The first to fourth wrinkled structures 110, 120, 130, and 140 may have shapes corresponding to the grooves 515 of the first mold 510. Portions of the package frame 100 may be bent to form the first to fourth wrinkled structures 110, 120, 130, and 140. Thus, as illustrated in FIG. 5B, the first surfaces 110a and 120a of the first and second wrinkled structures 110 and 120 may extend from the one surface 100a of the package frame 100, and the second surfaces 110b and 120b of the first and second wrinkled structures 110 and 120 may extend from the another surface 100b of the package frame 100. The first surfaces 110a and 120a may be formed in a plane different than the one surface 100a, and the second surfaces 110b and 120b may be formed in a plane different than the another surface 100b. First surfaces and second surfaces of the third and fourth wrinkled structures 130 and 140 may be disposed at substantially the same level as the first and second surfaces 110a, 120a, 110b, and 120b of the first and second wrinkled structures 110 and 120.

Since the wrinkled structures 110, 120, 130, and 140 are formed by a molding process using the first mold 510, a thickness T1 of the package frame 100 may be substantially equal to a thickness T2 of the first wrinkled structure 110 and a thickness T3 of the second wrinkled structure 120.

The number, positions, and shapes of the grooves 515 of the first mold 510 may be controlled to control the number, positions, and shapes of the wrinkled structures 110, 120, 130, and 140. Sizes and/or the shapes of the wrinkled structures 110, 120, 130, and 140 may be controlled by strain applied to a material (e.g., a solder-resist) covering the one surface 100a of the package frame 100. In exemplary embodiments, the sizes and/or the shapes of the wrinkled structures 110, 120, 130, and 140 may be controlled to prevent a crack from occurring on the one surface 100a of the package frame 100. The number, positions, and shapes of the groove 515 of the first mold 510 may vary according to exemplary embodiments of the inventive concept.

The unit regions UR may be laterally spaced apart from the grooves 515. Thus, the wrinkled structures 110, 120, 130, and 140 may not be formed in the unit regions UR. The one surface 100a and the another surface 100b of the package frame 100 of the unit regions UR may be substantially flat. Thereafter, the package frame 100 may be unloaded from the die 610 and the first mold 510. The first to fourth wrinkled structures 110, 120, 130, and 140 may have one of the shapes described with reference to FIGS. 2A to 2E and 3A to 3D package frame The package frame 100 according to exemplary embodiments of the inventive concept may have a relatively thin thickness. For example, according to exemplary embodiments, the package frame 100 may have a thickness of about 0.4 mm. According to exemplary embodiments, the package frame 100 may have a thickness of about 0.1 mm or less. As the package frame 100 becomes thinner, the stiffness of the package frame 100 may be reduced. For example, the stiffness of the package frame 100 may be inversely proportional to the cube of the thickness of the package frame 100. In comparative examples, when a package frame is thin, the package frame may be easily damaged during processes performed when manufacturing a semiconductor package. For example, the package frame may be bent, and a plurality of semiconductor chips disposed on the package frame 100 in a plurality of unit regions UR may be damaged when the package frame is damaged. However, according to exemplary embodiments of the inventive concept, the wrinkled structures 110, 120, 130, and 140 may be provided in planes different from the one surface 100a and the another surface 100b of the package frame 100. As illustrated in FIG. 5B, as a perpendicular distance between the first surface 110a and the one surface 100a and/or a perpendicular distance between the second surface 110b and the another surface 100b is increased, an effect similar to a thickness increase of the package frame 100 may occur. Thus, the stiffness of the package frame 100 may be increased. The first surfaces and the second surfaces of the third and fourth wrinkled structures 130 and 140 may have the same effect on the package frame 100 as the first surfaces 110a and 120a and the second surfaces 110b and 120b of the first and second wrinkled structures 110 and 120.

According to exemplary embodiments of the inventive concept, the wrinkled structures 110, 120, 130, and 140 may be formed by the molding process using the first mold 510. The package frame 100 may include insulating layers and conductive patterns disposed between the insulating layers. The conductive patterns may include a metal (e.g., copper) and may be provided in the peripheral region PR as well as the unit regions UR. The formation process of the wrinkled structures 110, 120, 130, and 140 is not limited to the molding process described herein.

Referring to FIGS. 6A and 6B, semiconductor chips 200 may be mounted on the one surface 100a of the package frame 100. The semiconductor chips 200 may be provided on the package frame 100 of the chip regions UR1, respectively. The semiconductor chips 200 may be electrically connected to the pads 109 through connecting parts 210. The connecting parts 210 may have a solder ball shape or a bump shape and may include a conductive material. However, the connecting parts 210 are not limited thereto. The semiconductor chips 200 may be mounted by one of various methods. For example, in exemplary embodiments, the semiconductor chips 200 may be electrically connected to the pads 109 through bonding wires.

A molding layer 300 may be formed on the one surface 100a of the package frame 100 and may cover the semiconductor chips 200. For example, as illustrated in FIG. 6B, the package frame 100 may be provided in a second mold 520. The second mold 520 may include a lower plate 521 and an upper plate 522. A cavity 525 may be provided between the lower plate 521 and the upper plate 522. The package frame 100 in the unit regions UR may be provided in the cavity 525 of the second mold 520, and the package frame 100 in the peripheral region PR may be in contact with the second mold 520. Surfaces of the second mold 520, which are in contact with the package frame 100 of the peripheral region PR, may be substantially flat. For example, a bottom surface of the upper plate 522 and a top surface of the lower plate 521, which are in contact with the package frame 100 of the peripheral region PR, may be substantially flat. Pressure may be applied to the second mold 520 to remove the wrinkled structures 110, 120, 130, and 140 of FIGS. 5A and 5B of the peripheral region PR. For example, pressure may be applied to the wrinkled structures 110, 120, 130, and 140 of FIGS. 5A and 5B via the second mold 520, causing the wrinkled structures 110, 120, 130, and 140 to become flat. That is, the second mold 520 may be pressed to remove at least one of the wrinkled structures 110, 120, 130, and 140. The first surfaces 110a and 120a may be disposed in substantially the same plane as the one surface 100a, and the second surfaces 110b and 120b may be disposed in substantially the same plane as the another surface 100b. The first surfaces and the second surfaces of the third and fourth wrinkled structures 130 and 140 may be disposed at substantially the same planes as the one surface 100a and the another surface 100b, respectively.

An epoxy molding compound (EMC) may be supplied into the cavity 525 of the second mold 520 to cover the one surface 100a in the unit regions UR. Thus, the molding layer 300 may be formed on the package frame 100 in the unit regions UR. The one surface 100a in the peripheral region PR may be covered with the second mold 520, resulting in the molding layer 300 not being formed in the peripheral region PR.

The molding layer 300 may extend between the package frame 100 and the semiconductor chips 200. For example, the molding layer 300 may fill a space between the connecting parts 210. Alternatively, in exemplary embodiments, before the formation of the molding layer 300, an additional underfill layer may be formed between the package frame 100 and the semiconductor chips 200.

Referring to FIGS. 7A and 7B, the unit regions UR may be separated from each other. For example, the package frame 100 may be cut/sawed to separate the unit regions UR from one another. The unit regions UR may be formed into semiconductor packages 1, respectively. As illustrated in FIG. 7B, each of the semiconductor packages 1 may include a unit substrate 100u, the semiconductor chip 200, and a unit molding layer 300u. The package frame 100 may be divided into the unit substrates 100u by the sawing process. The unit substrate 100u may correspond to a portion of the package frame 100 included in each of the unit regions UR separated from one another. The molding layer 300 of FIGS. 6A and 6B may be divided into the unit molding layers 300u by the sawing process. A heat dissipation part may be provided on the semiconductor chip 200. The heat dissipation part may include, for example, a heat slug or a heat sink.

If the wrinkled structures 110, 120, 130, and 140 remain on the package frame 100 after the formation of the molding layer 300, difficulties relating to handling the package frame 100 during processes performed after the formation of the molding layer 300 may arise. However, according to exemplary embodiments of the inventive concept, the wrinkled structures 110, 120, 130, and 140 may be removed during the formation of the molding layer 300, as described with reference to FIGS. 6A and 6B. Thus, the package frame 100 having the molding layer 300 may not have the wrinkled structures 110, 120, 130, and 140. For example, according to exemplary embodiments, the one surface 100a and the another surface 100b of the package frame 100 of the peripheral region PR may become substantially flat (e.g., via removal of the wrinkled structures 110, 120, 130, and 140) after the formation of the molding layer 300. Thus, the package frame 100 may be properly handled during processes (e.g., a transfer process and/or a sawing process) performed after the formation of the molding layer 300.

Figure 8:
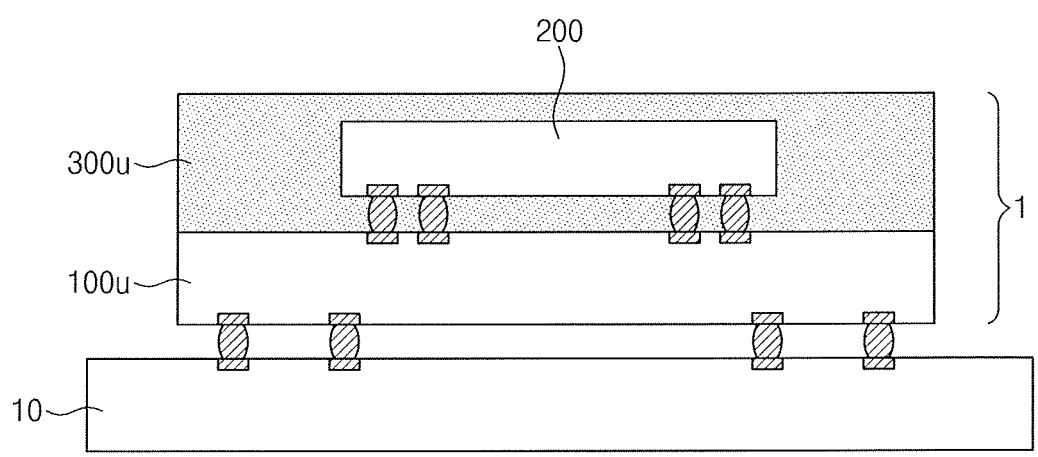
FIG. 8 is a cross-sectional view illustrating a semiconductor package according to an exemplary embodiment of the inventive concept.

FIG. 8 is a cross-sectional view illustrating a semiconductor package according to an exemplary embodiment of the inventive concept. Hereinafter, one semiconductor package will be described as an example.

Referring to FIG. 8, a semiconductor package 1 may be mounted on a mother substrate 10. The semiconductor package 1 may be one of the semiconductor packages manufactured using the method described above with reference to FIGS. 4A to 7A and 4B to 7B. For example, the semiconductor package 1 may include the unit substrate 100u, the semiconductor chip 200, and the unit molding layer 300u. The unit substrate 100u may correspond to the portion of the package frame 100 included in one of the unit regions UR described above with reference to FIGS. 1, 2A to 2E, and 3A to 3D. In exemplary embodiments, the mother substrate 10 may correspond to the portion of the package frame 100 included in one of the unit regions UR described above with reference to FIGS. 1, 2A to 2E, and 3A to 3D.

FIGS. 9A to 9H are plan views illustrating package frames according to exemplary embodiments of the inventive concept. Hereinafter, for convenience of explanation, a further description of elements and processes previously described may be omitted.

Referring to FIGS. 9A to 9H, a package frame 100 may include unit regions UR and a peripheral region PR provided on its one surface 100a, as described above. Wrinkled structures 110, 120, 130, and 140 may be provided in the peripheral region PR. Each of the wrinkled structures 110, 120, 130, and 140 may have the cross-section of one of the exemplary embodiments described with reference to FIGS. 2A to 2E and 3A to 3D.

Figure 9A:
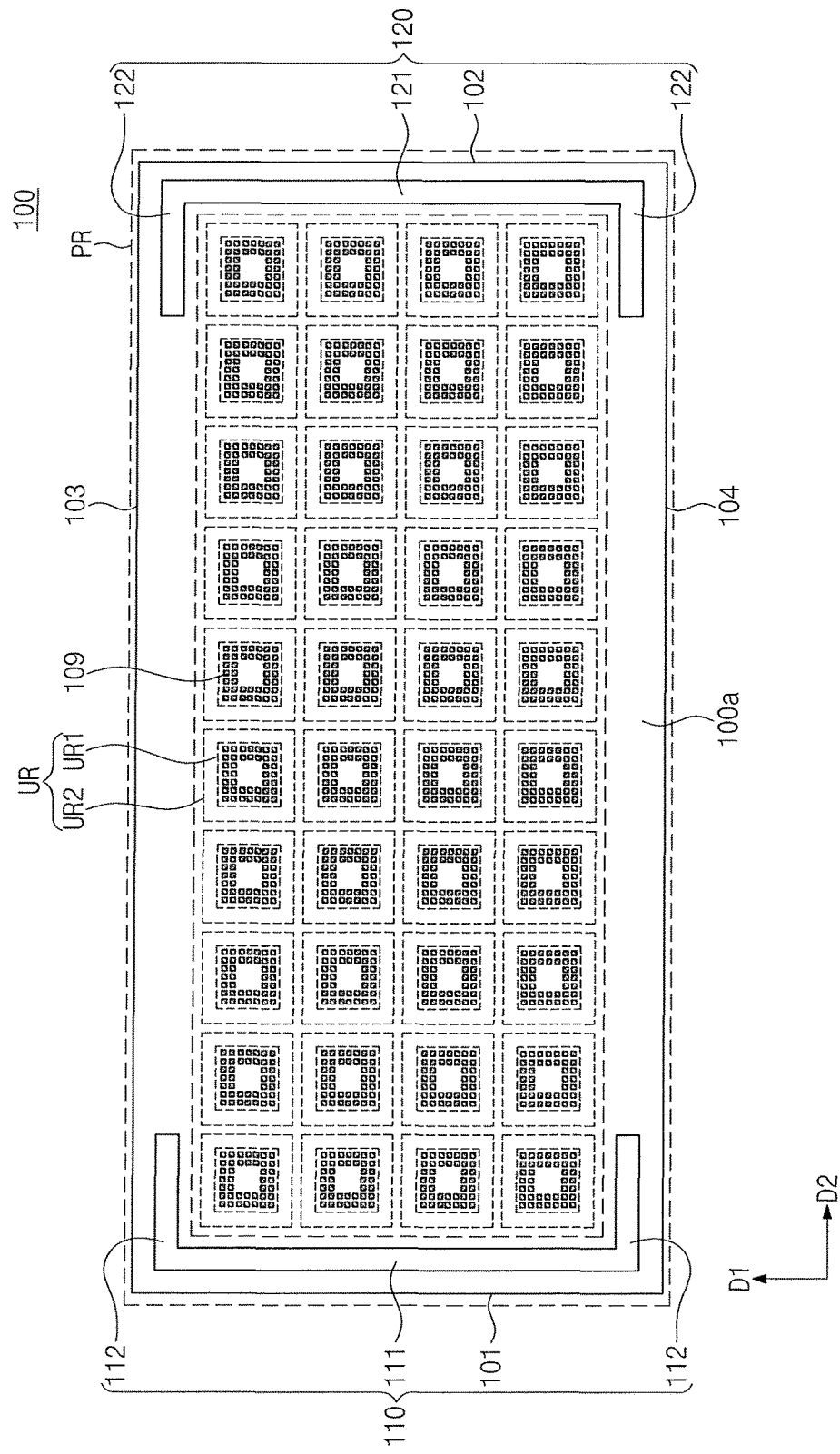
FIGS. 9A to 9H are plan views illustrating package frames according to exemplary embodiments of the inventive concept.

Referring to FIG. 9A, a first wrinkled structure 110 may include a first portion 111 extending in the first direction D1 and second portions 112 extending respectively from the ends of the first portion 111 in the second direction D2. Similarly, a second wrinkled structure 120 may include a first portion 121 extending in the first direction D1 and second portions 122 extending respectively from the ends of the first portion 121 in the second direction D2. For example, the first portion 111 of the first wrinkled structure 110 may be provided between the first side 101 and the unit regions UR. The second portions 112 of the first wrinkled structure 110 may be connected to the ends of the first portion 111 and may be provided between the third side 103 and the unit regions UR and between the fourth side 104 and the unit regions UR, respectively. The second wrinkled structure 120 and the first wrinkled structure 110 may be symmetrical.

The first side 101 and the second side 102 may be disposed at both ends of the long axis of the one surface 100a. That is, the first side 101 and the second side 102 may be disposed at opposite ends of the package frame 100 in the second direction D2. For example, the first side 101 and the second side 102 may be disposed at opposite ends of the one surface 100a in a lengthwise direction. In a comparative example in which the first and second wrinkled structures 110 and 120 are not utilized, during processes of manufacturing a semiconductor package, portions of the package frame 100 adjacent to the first and/or second sides 101 and/or 102 may be bent more than other portions of the package frame 100. However, according to exemplary embodiments of the inventive concept, the first and second wrinkled structures 110 and 120 may be provided to be adjacent to the first and second sides 101 and 102, which may reduce the bending phenomenon of the package frame 100.

Figure 9B:
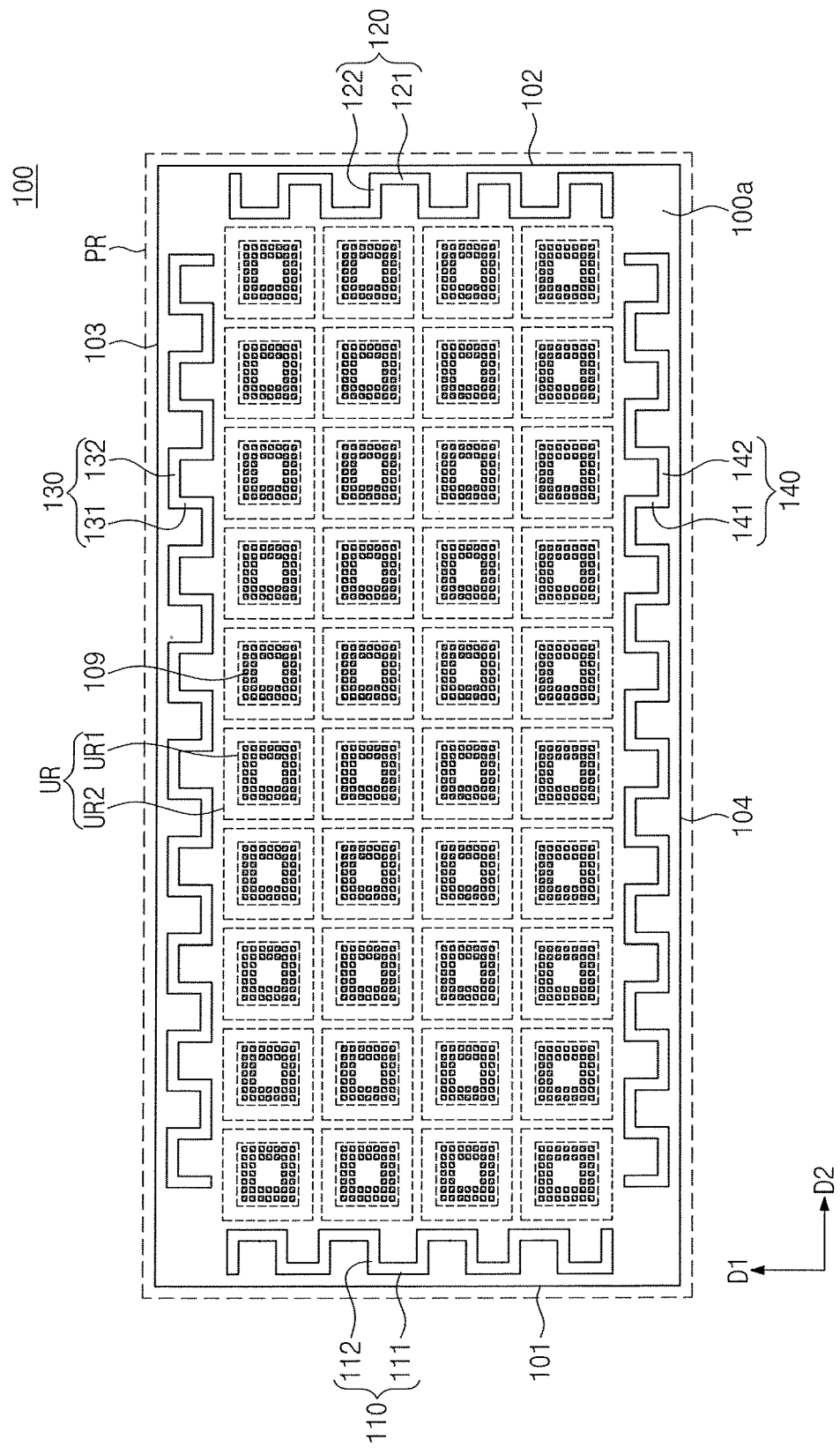

Referring to FIG. 9B, in an exemplary embodiment, each of the wrinkled structures 110, 120, 130, and 140 may have an angular uneven shape when viewed from a plan view. For example, each of first and second wrinkled structures 110 and 120 may have a long axis extending in the first direction D1. That is, the longest side of each of the first and second wrinkled structures 110 and 120 may extend in the first direction D1 (e.g., each of the first and second wrinkled structures 110 and 120 may extend lengthwise in the first direction D1). The first wrinkled structure 110 may include first portions 111 extending in the first direction D1 and second portions 112 extending in the second direction D2. The second portions 112 may be connected to the first portions 111. The first portions 111 may be arranged, for example, in a zigzag form along the first direction D1. Similarly, the second wrinkled structure 120 may include first portions 121 extending in the first direction D1 and second portions 122 extending in the second direction D2. The second portions 122 may be connected to the first portions 121. The first portions 121 of the second wrinkled structure 120 may be arranged in a zigzag form along the first direction D1. A shape of each of the third and fourth wrinkled structures 130 and 140 may have about 90-degree or about 270-degree rotational symmetry with respect to the first wrinkled structure 110. For example, the third wrinkled structure 130 may include first portions 131 extending in the first direction D1 and second portions 132 extending in the second direction D2. The second portions 132 may be connected to the first portions 131. The second portions 132 may be arranged in a zigzag form along the second direction D2. Similarly, the fourth wrinkled structure 140 may include first portions 141 extending in the first direction D1 and second portions 142 extending in the second direction D2. The second portions 142 may be connected to the first portions 141. The second portions 142 may be arranged in a zigzag form along the second direction D2. In exemplary embodiments, one or some of the first to fourth wrinkled structures 110, 120, 130, and 140 may be omitted.

Figure 9C:
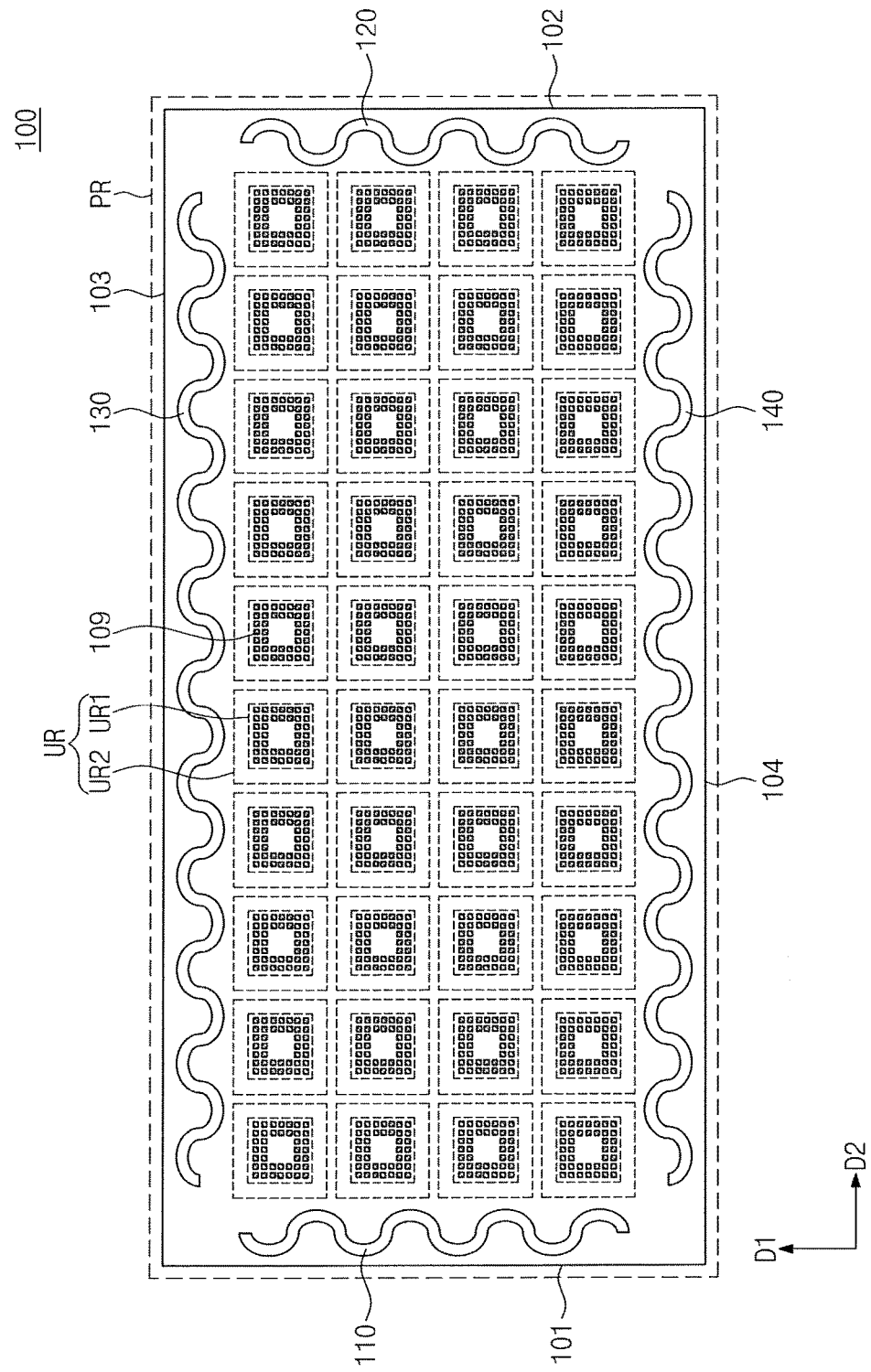

Referring to FIG. 9C, in an exemplary embodiment, each of the wrinkled structures 110, 120, 130, and 140 may have an uneven shape (e.g., a sine-wave shape) when viewed from a plan view. First, second, third, and fourth wrinkled structures 110, 120, 130, and 140 may be provided between first, second, third, and fourth sides 101, 102, 103, and 104 and the unit regions UR, respectively. Each of the first and second wrinkled structures 110 and 120 may have a long axis extending in the first direction D1. Each of the first and second wrinkled structures 110 and 120 may have a wave shape that extends in the first direction D1 (e.g., each of the first and second wrinkled structures 110 and 120 may have a wave shape in a lengthwise direction). Each of the third and fourth wrinkled structures 130 and 140 may have a long axis extending in the second direction D2. Each of the third and fourth wrinkled structures 130 and 140 may have a wave shape that extends in the second direction D2.

Figure 9D:
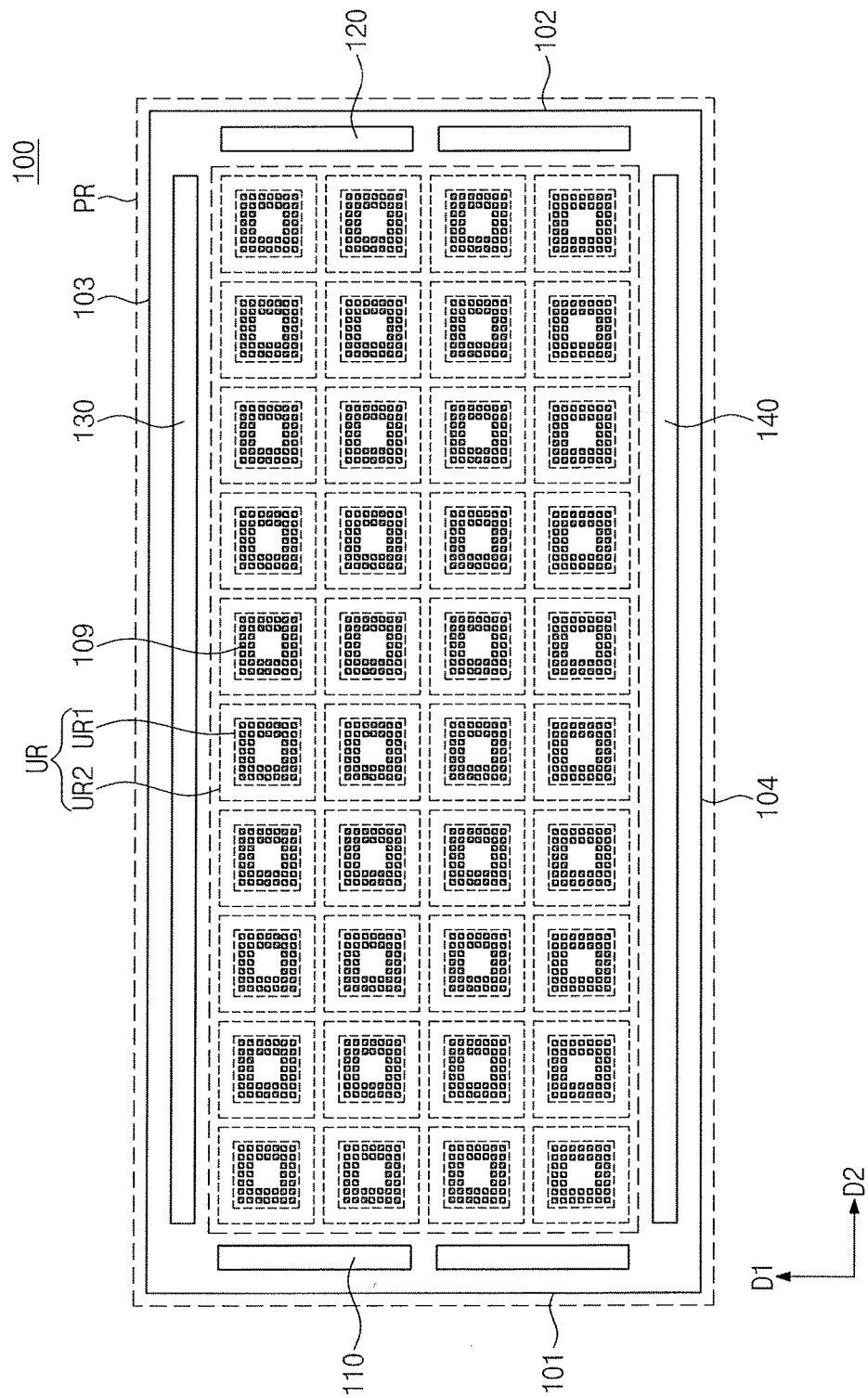
Figure 9E:
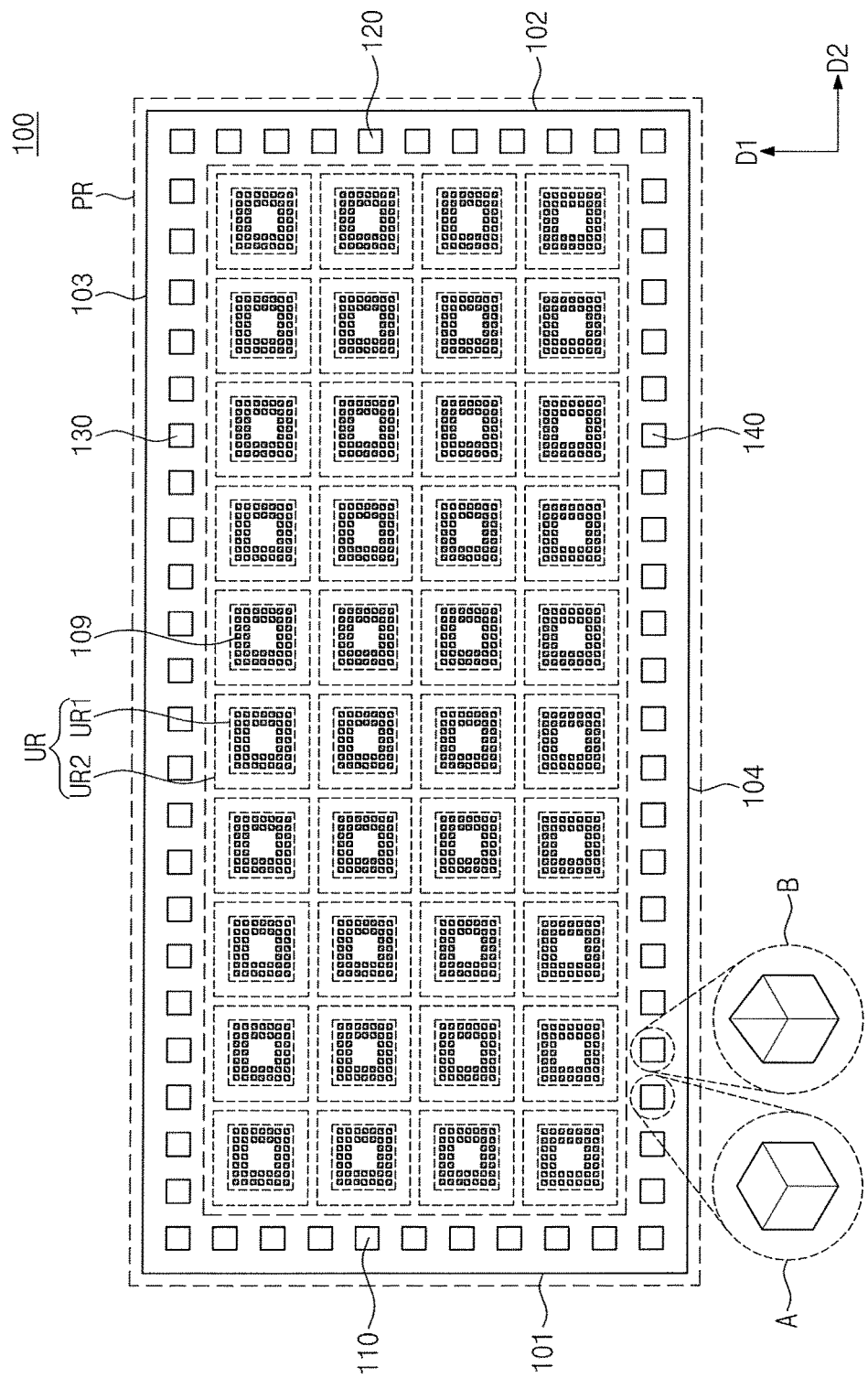
Figure 9F:
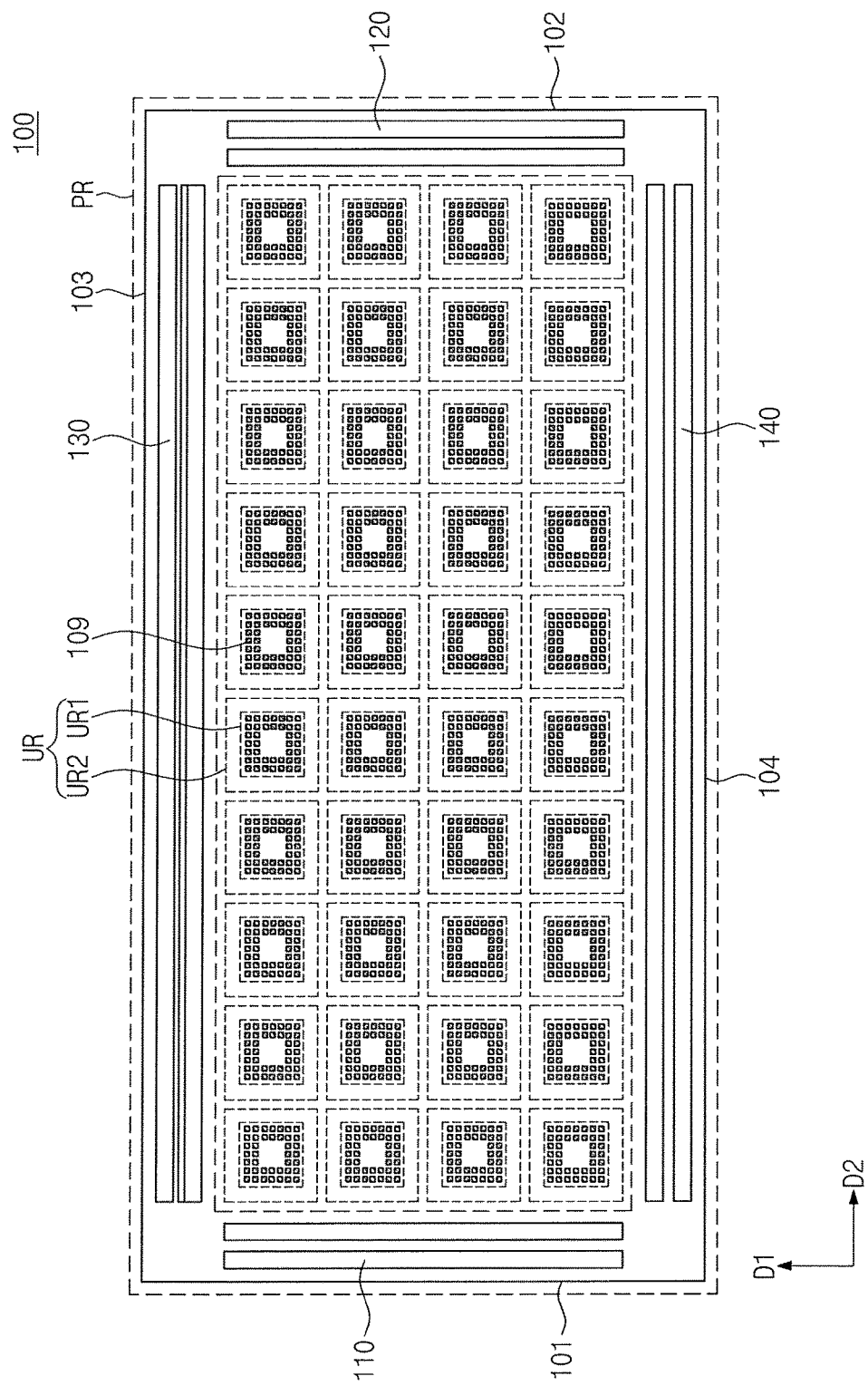

Referring to FIGS. 9D, 9E, and 9F, at least one of the first to fourth wrinkled structures 110, 120, 130, and 140 may be provided in a plurality. For example, in an exemplary embodiment of FIG. 9D, the first wrinkled structure 110 may be provided in a plurality, and the second wrinkled structure 120 may be provided in a plurality. Although FIG. 9D illustrates two first wrinkled structures 110 and two second wrinkled structures 120, exemplary embodiments are not limited thereto. For example, each of the first and second wrinkled structures 110 and 120 may include at least two or more structures. Further, the number of structures included in the first and second wrinkled structures 110 and 120 may be the same or different. The first wrinkled structures 110 may be adjacent to the first side 101 and may be arranged in the first direction D1. The second wrinkled structures 120 may be adjacent to the second side 102 and may be arranged in the first direction D1. The third and fourth wrinkled structures 130 and 140 may have substantially the same shapes as the third and fourth wrinkled structures 130 and 140 described with reference to FIG. 1.

Referring to FIG. 9E, in an exemplary embodiment, each of the first to fourth wrinkled structures 110, 120, 130, and 140 may be provided in a plurality. The first wrinkled structures 110 may be adjacent to the first side 101 and may be arranged in the first direction D1. The second wrinkled structures 120 may be adjacent to the second side 102 and may be arranged in the first direction D1. The third wrinkled structures 130 may be adjacent to the third side 103 and may be arranged in the second direction D2. The fourth wrinkled structures 140 may be adjacent to the fourth side 104 and may be arranged in the second direction D2. Each of the first to fourth wrinkled structures 110, 120, 130, and 140 may include at least two or more structures, and the number of structures included in the first to fourth wrinkled structures 110, 120, 130, and 140 may be the same or different. In exemplary embodiments, at least one of the wrinkled structures 110, 120, 130, and 140 may be omitted. According to exemplary embodiments, each of the first to fourth wrinkled structures 110, 120, 130, and 140 may have, for example, a hexahedral shape as illustrated in the enlarged view of portion 'A' or a pin-point shape as illustrated in the enlarged view of portion 'B'. The pin-point shape may include, for example, a hexahedral structure and a pyramidal structure disposed on the hexahedral structure.

Referring to FIG. 9F, in an exemplary embodiment, each of the first to fourth wrinkled structures 110, 120, 130, and 140 may be provided in a plurality. For example, the first wrinkled structures 110 may be adjacent to the first side 101, and may extend in the first direction D1 substantially in parallel to each other. That is, the first wrinkled structures 110 may extend in the first direction D1 and may be arranged in the second direction D2. The second wrinkled structures 120 may be adjacent to the second side 102 and may extend in the first direction D1 substantially in parallel to each other. That is, the second wrinkled structures 120 may extend in the first direction D1 and may be arranged in the second direction D2. The third wrinkled structures 130 may be adjacent to the third side 103 and may extend in the second direction D2 in parallel to each other. That is, the third wrinkled structures 130 may extend in the second direction D2 and may be arranged in the first direction D1. The fourth wrinkled structures 140 may be adjacent to the fourth side 104 and may extend in the second direction D2 in parallel to each other. That is, the fourth wrinkled structures 140 may extend in the second direction D2 and may be arranged in the first direction D1. Each of the first to fourth wrinkled structures 110, 120, 130, and 140 may include at least two or more structures, and the number of structures included in the first to fourth wrinkled structures 110, 120, 130, and 140 may be the same or different. In exemplary embodiments, one or some of the first to fourth wrinkled structures 110, 120, 130, and 140 may be a single structure, and at least one other structure of the first to fourth structures 110, 120, 130, and 140 may be provided in a plurality.

As shown in FIGS. 9D to 9F, according to exemplary embodiments, a plurality of wrinkled structures may be disposed between one side of the package frame 100 and the unit regions UR (e.g., all of the unit regions UR).

Figure 9G:
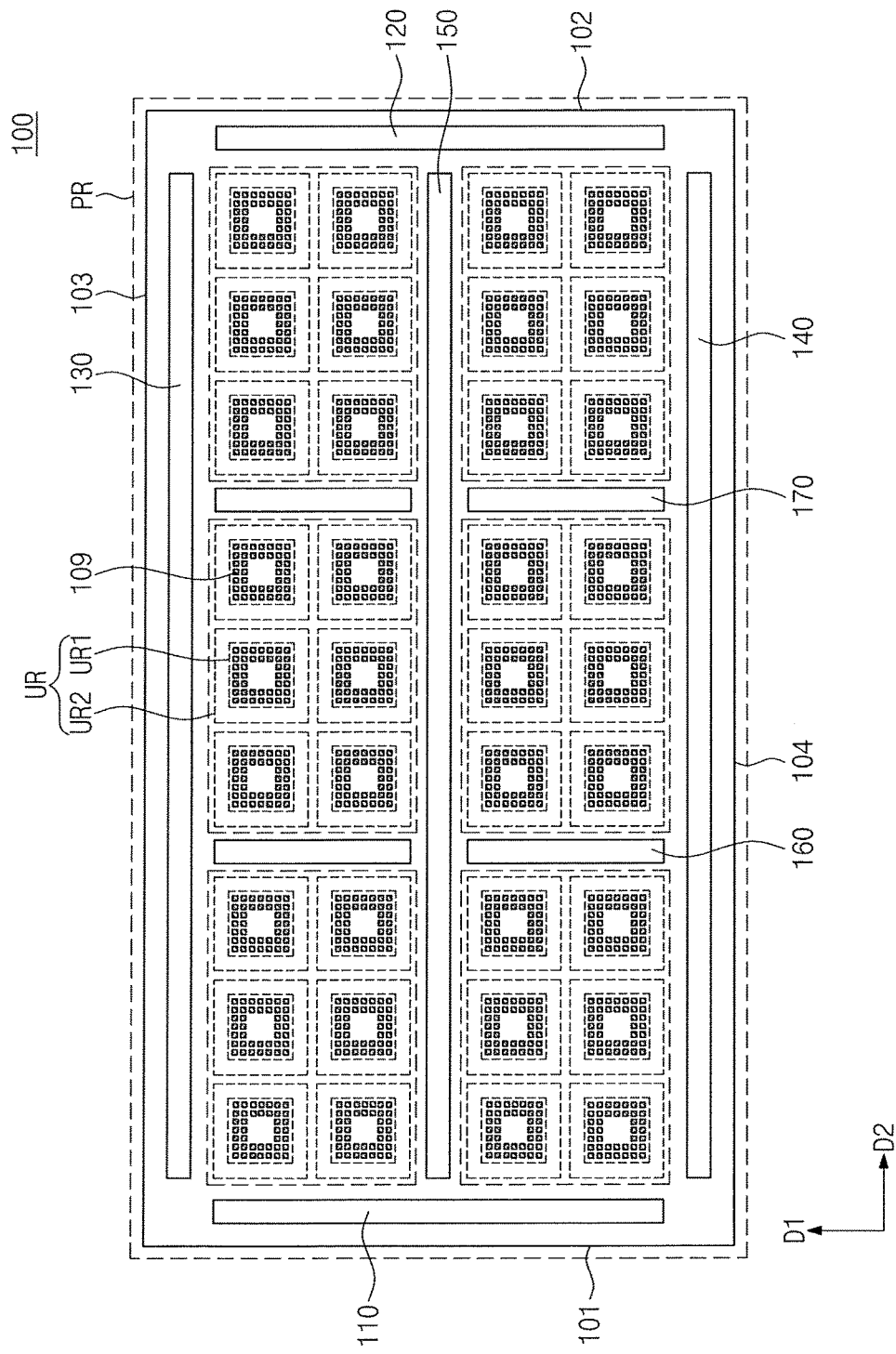

Referring to FIG. 9G, in an exemplary embodiment, the first to fourth wrinkled structures 110, 120, 130, and 140 may be adjacent to the first to fourth sides 101, 102, 103, and 140, respectively. Positions and shapes of the first to fourth wrinkled structures 110, 120, 130, and 140 may be the same as those of the first to fourth wrinkled structures 110, 120, 130, and 140 of FIG. 1. The peripheral region PR may be provided between the unit regions UR as well as between the unit regions UR and the sides 101, 102, 103, and 104. Fifth, sixth, and seventh wrinkled structures 150, 160, and 170 may be disposed in the peripheral region PR between the unit regions UR. The fifth wrinkled structure 150 may be provided between the unit regions UR and may extend in the second direction D2. The sixth and seventh wrinkled structures 160 and 170 may extend in the first direction D1 between the unit regions UR. The sixth wrinkled structures 160 may be spaced apart from the third to fifth wrinkled structures 130, 140, and 150. In exemplary embodiments, the sixth wrinkled structures 160 may be connected to each other to constitute one single connected body, or may be connected to at least one of the third to fifth wrinkled structures 130, 140, and 150. In exemplary embodiments, at least one of the fifth to seventh wrinkled structures 150, 160, and 170 may be omitted. In exemplary embodiments, the first to fourth wrinkled structures 110, 120, 130, and 140 may have the shape and the arrangement described with reference to FIG. 9B, 9C, 9D, 9E, or 9F. However, exemplary embodiments of the inventive concept are not limited thereto. According exemplary embodiments, the fifth to seventh wrinkled structures 150, 160, and 170 may be further provided, resulting in an increase in the stiffness of the package frame 100.

Figure 9H:
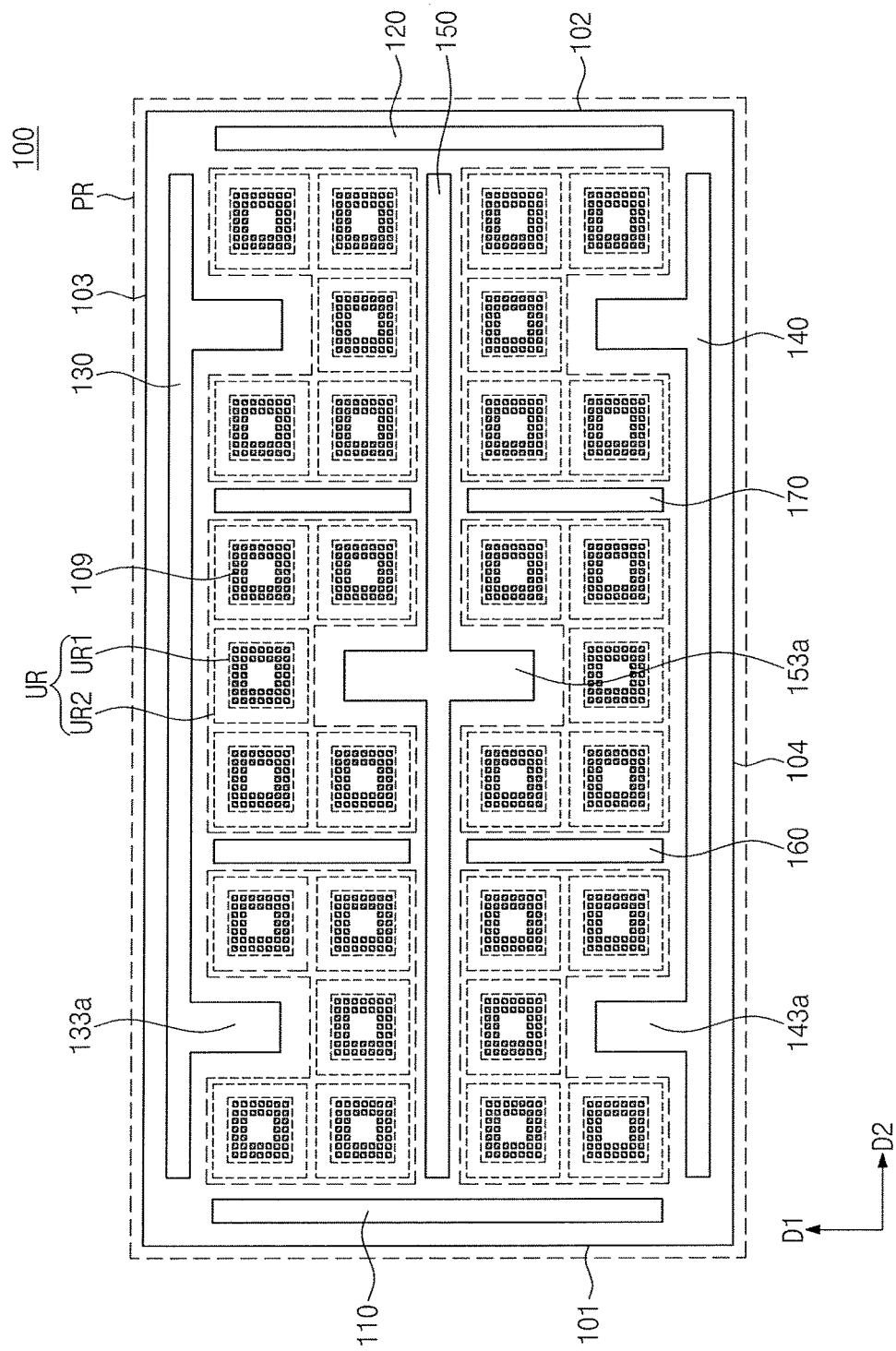

Referring to FIG. 9H, in an exemplary embodiment, first to fourth wrinkled structures 110, 120, 130, and 140 may be adjacent to the first to fourth sides 101, 102, 103, and 104, respectively. Positions and shapes of the first and second wrinkled structures 110 and 120 may be the same as described with reference to FIG. 1. The peripheral region PR may be provided between the unit regions UR as well as between the unit regions UR and the sides 101, 102, 103, and 104. Fifth to seventh wrinkled structures 150, 160, and 170 may be provided in the peripheral region PR between the unit regions UR. Positions of the fifth to seventh wrinkled structures 150, 160, and 170 may be the same as those of fifth to seventh wrinkled structures 150, 160, and 170 of FIG. 9G. The fifth to seventh wrinkled structures 150, 160, and 170 may include the same shapes as the fifth to seventh wrinkled structures 150, 160, and 170 of FIG. 9G.

In the exemplary embodiment of FIG. 9H, the third to fifth wrinkled structures 130, 140, and 150 may further include protrusions 133a, 143a, and 153a extending between the unit regions UR, respectively. Positions and planar shapes of the protrusions 133a, 143a, and 153a of the third to fifth wrinkled structures 130, 140, and 150 may be variously modified. In exemplary embodiments, one or some of the protrusions 133a, 143a, and 153a of the third to fifth wrinkled structures 130, 140, and 150 may be omitted. In exemplary embodiments, at least one of the first, second, sixth, and seventh wrinkled structures 110, 120, 160, and 170 may further include a protrusion extending between the unit regions UR.

Figure 10A:
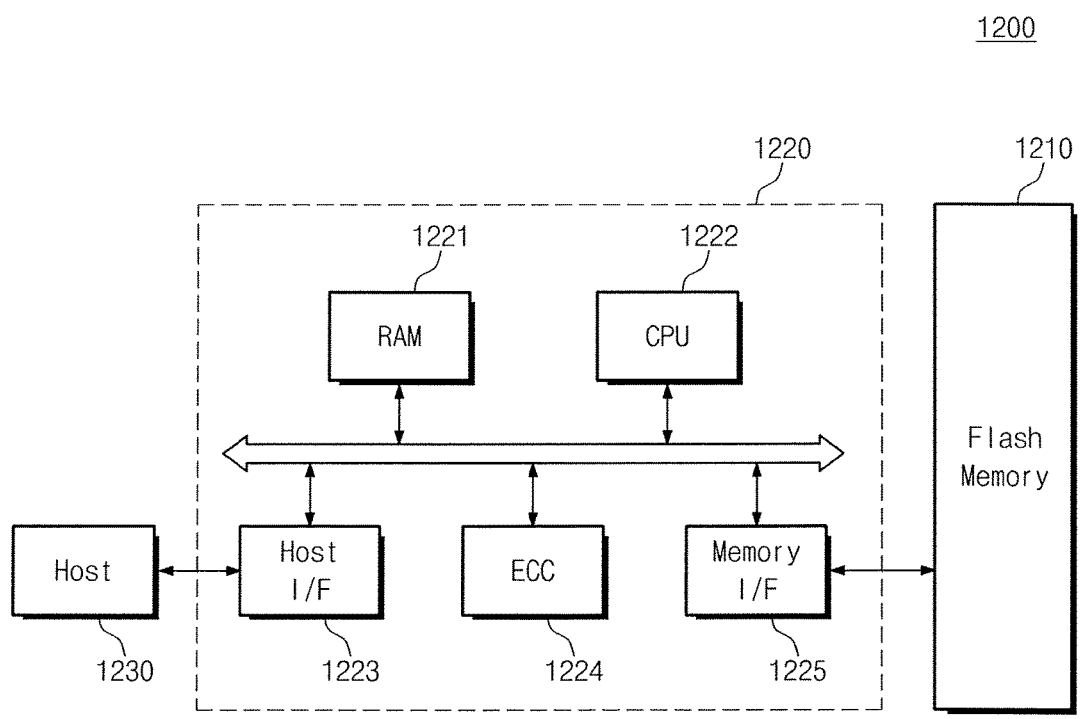
FIG. 10A is a schematic block diagram illustrating a memory card including a semiconductor package according to exemplary embodiments of the inventive concept.
Figure 10B:
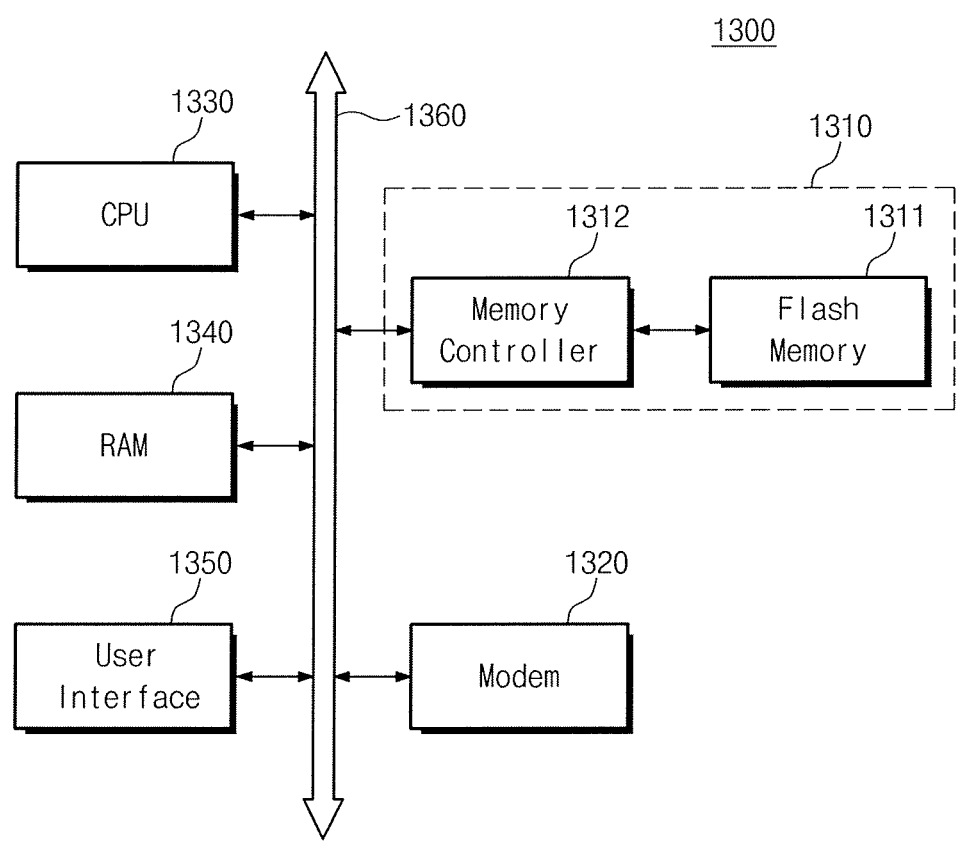
FIG. 10B is a schematic block diagram illustrating an information processing system including a semiconductor package according to exemplary embodiments of the inventive concept.

FIG. 10A is a schematic block diagram illustrating a memory card including a semiconductor package according to exemplary embodiments of the inventive concept. FIG. 10B is a schematic block diagram illustrating an information processing system including a semiconductor package according to exemplary embodiments of the inventive concept.

Referring to FIG. 10A, a memory card 1200 may include a memory controller 1220 that controls data communication between a host 1230 and a memory device 1210. A random access memory (RAM) 1221 may be used as a working memory of a central processing unit (CPU) 1222. A host interface unit 1223 may be configured to include a data communication protocol between the memory card 1200 and the host. An error check and correction (ECC) block 1224 may detect and correct errors of data which are read out from the memory device 1210. A memory interface unit 1225 may interface with the memory device 1210. The CPU 1222 may perform overall operations for data communication of the memory controller 1220. The memory device 1210 may include at least one of the semiconductor packages according to the aforementioned exemplary embodiments of the inventive concept.

Referring to FIG. 10B, an information processing system 1300 may include a memory system 1310 implemented with at least one of the semiconductor packages according to the aforementioned exemplary embodiments. The information processing system 1300 may include a mobile device or a computer. For example, the information processing system 1300 may include the memory system 1310, a modem 1320, a central processing unit (CPU) 1330, a RAM 1340, and a user interface unit 1350 which are electrically connected to a system bus 1360. The memory system 1310 may include a memory device 1311 and a memory controller 1312. In an exemplary embodiment, the memory system 1310 may have the same structure as the memory card 1200 of FIG. 10A. Data processed by the CPU 1330 and/or data inputted from an external system may be stored in the memory system 1310. The information processing system 1300 may be realized as, for example, a memory card, a solid state disk (SSD), a camera image sensor, or another application chipset device.

According to exemplary embodiments of the inventive concept, the wrinkled structure may be formed in the peripheral region of the package frame. Inclusion of the wrinkled structure on the package frame may have a similar effect to increasing the thickness of the package frame. Thus, the package frame according to exemplary embodiments provides the benefits of a package frame having a high stiffness while maintaining a relatively thin thickness. As a result, the durability of the package frame while being handled during the processes of manufacturing the semiconductor package may be improved.

According to exemplary embodiments of the inventive concept, the wrinkled structure may be formed using a mold during a molding process, and may be subsequently removed during a process of forming a molding layer or during a sawing process. As a result, the durability of the package frame may be improved during manufacturing without limiting the available space on the package frame for the placement of semiconductor elements (e.g., semiconductor elements may be subsequently placed in the location that the wrinkled structure was previously disposed).

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:
1. A printed circuit board, comprising:
a plurality of unit regions disposed on one surface of the printed circuit board,
wherein each of the unit regions is configured to receive a semiconductor chip on the one surface, and each semiconductor chip overlaps the one surface when received in the corresponding unit region;
a peripheral region surrounding the unit regions on the one surface,
wherein a wrinkled structure is formed in the one surface in the peripheral region,
wherein a first surface of the wrinkled structure extends from the one surface and is disposed at a different level than the one surface,
wherein the first surface of the wrinkled structure is directly connected to the one surface of the printed circuit board,
wherein each of the unit regions comprises a plurality of conductive pads for electrical connection to the corresponding semiconductor chip.
2. The printed circuit board of claim 1, wherein the wrinkled structure comprises:
a second surface extending from another surface of the printed circuit board,
wherein the second surface of the wrinkled structure is disposed at a different level than the another surface and the another surface opposes the one surface.
3. The printed circuit board of claim 2, wherein the first surface of the wrinkled structure is recessed from the one surface, and the second surface of the wrinkled structure protrudes from the another surface.
4. The printed circuit board of claim 2, wherein a distance between the first surface and the second surface is substantially equal to a distance between the one surface and the another surface.
5. The printed circuit board of claim 1, wherein the wrinkled structure is inclined, and the one surface disposed at one side of the wrinkled structure is lower than the one surface disposed at another side of the wrinkled structure.
6. The printed circuit board of claim 1, wherein the wrinkled structure extends lengthwise in a first direction and has a uniform thickness along the first direction.
7. The printed circuit board of claim 1, wherein the wrinkled structure comprises a plurality of wrinkled structures and thicknesses of the plurality of wrinkled structures are substantially equal to each other.

8. The printed circuit board of claim 1, wherein the wrinkled structure comprises a plurality of wrinkled structures, and
the plurality of wrinkled structures are disposed between a first side of the one surface and the unit regions.

9. The printed circuit hoard of claim 1, wherein the wrinkled structure has a polygonal cross-section.

10. The printed circuit board of claim 1, wherein the wrinkled structure has a rounded cross-section.

11. A printed circuit board, comprising:
a plurality of unit regions disposed on one surface of the printed circuit board,
wherein a wrinkled structure is formed in the one surface,
wherein a first surface of the wrinkled structure extends from the one surface and is disposed at a different level than the one surface,
wherein each of the unit regions comprises a chip region and a molding region surrounding the chip region, wherein the first surface of the wrinkled structure is directly connected to the one surface of the printed circuit board,
wherein each of the chip regions is configured to receive a semiconductor chip on the one surface, and each semiconductor chip overlaps the one surface when received in the corresponding chip region,
wherein the unit regions are not overlapped with the wrinkled structure in a plan view.

12. The printed circuit board of claim 11, wherein a thickness of the wrinkled structure is substantially equal to a thickness of the printed circuit board in the unit regions.

13. The printed circuit board of claim 11, wherein the wrinkled structure is recessed from the one surface and protrudes from another surface of the printed circuit board that opposes the one surface.

14. The printed circuit board of claim 11, wherein the wrinkled structure comprises:
a first wrinkled structure disposed between a first side of the one surface and the unit regions; and
a second wrinkled structure disposed between a second side of the one surface and the unit regions,
wherein the second side opposes the first side.

15. The printed circuit board of claim 11, wherein the wrinkled structure is disposed between the unit regions.

16. The printed circuit board of claim 11, further comprising:
a plurality of conductive pads provided on the one surface of the chip region.

17. The printed circuit board of claim 16,
wherein the chip region is provided for mounting the semiconductor chip, and the conductive pads are provided for an electrical connection of the semiconductor chip.

* * * * *